United States Patent [19]
Uchida et al.

[11] Patent Number: 5,177,584
[45] Date of Patent: Jan. 5, 1993

[54] SEMICONDUCTOR INTEGRATED CIRCUIT DEVICE HAVING BIPOLAR MEMORY, AND METHOD OF MANUFACTURING THE SAME

[75] Inventors: Akihisa Uchida; Yuji Yatsuda; Katsumi Ogiue; Kazuo Nakazato; Takahiro Onai, all of Tokyo, Japan

[73] Assignee: Hitachi, Ltd., Tokyo, Japan

[21] Appl. No.: 647,220

[22] Filed: Jan. 28, 1991

Related U.S. Application Data

[63] Continuation of Ser. No. 336,013, Apr. 18, 1989, abandoned.

[30] Foreign Application Priority Data

Apr. 11, 1988 [JP] Japan ................... 63-88507
Apr. 11, 1988 [JP] Japan ................... 63-88508

[51] Int. Cl.⁵ .................. H01L 29/48; H01L 29/72
[52] U.S. Cl. .................. 257/477; 257/566; 257/577; 257/578; 257/586
[58] Field of Search .................. 357/15, 34, 92, 90, 357/88

[56] References Cited

U.S. PATENT DOCUMENTS

| | | | |
|---|---|---|---|
| 4,357,622 | 11/1982 | Maglo et al. | 357/90 |
| 4,388,636 | 12/1983 | Lohstroh | 357/34 |
| 4,433,470 | 2/1984 | Kamegawa et al. | 357/92 |
| 4,535,531 | 9/1985 | Bheko et al. | 357/34 |
| 4,617,724 | 10/1986 | Yokoyama et al. | 357/34 |
| 4,694,321 | 9/1987 | Woshio et al. | 357/92 |
| 4,815,037 | 3/1989 | Toyoda et al. | 357/92 |
| 4,858,184 | 9/1989 | Homma et al. | 307/321 |
| 4,949,145 | 9/1990 | Yano et al. | 357/90 |
| 4,949,162 | 9/1990 | Tamaki et al. | 357/35 |

FOREIGN PATENT DOCUMENTS 61-104655 5/1986 Japan.

Primary Examiner—J. Carroll
Attorney, Agent, or Firm—Antonelli, Terry, Stout & Kraus

[57] ABSTRACT

A bipolar SRAM which includes a forward bipolar transistor and a reverse bipolar transistor on an identical semiconductor substrate, is disclosed. Concretely, the base region of the reverse bipolar transistor is formed at a deeper position of the substrate than the base region of the forward bipolar transistor, thereby to heighten the cutoff frequency $f_T$ of the reverse bipolar transistor.

7 Claims, 13 Drawing Sheets

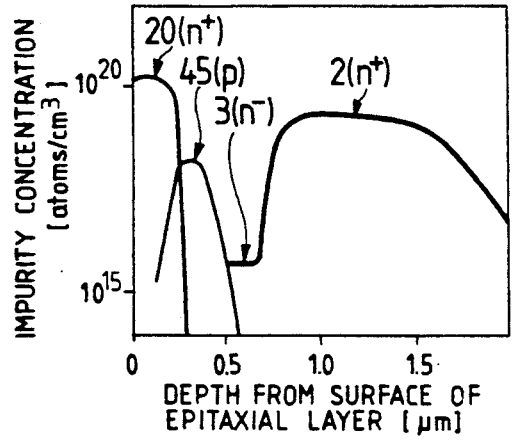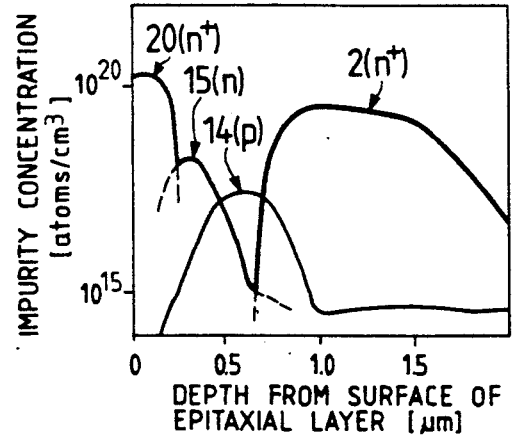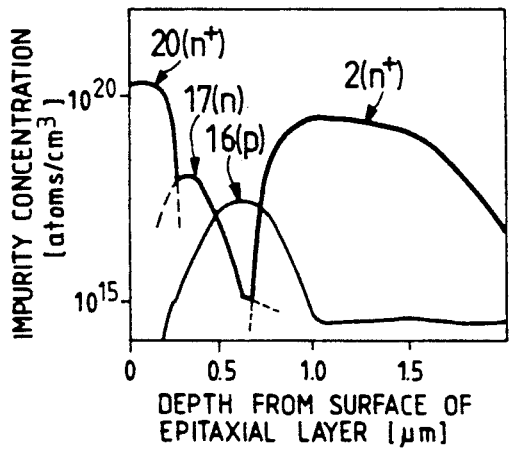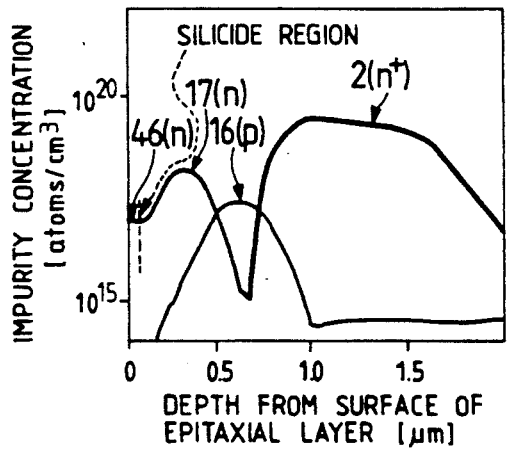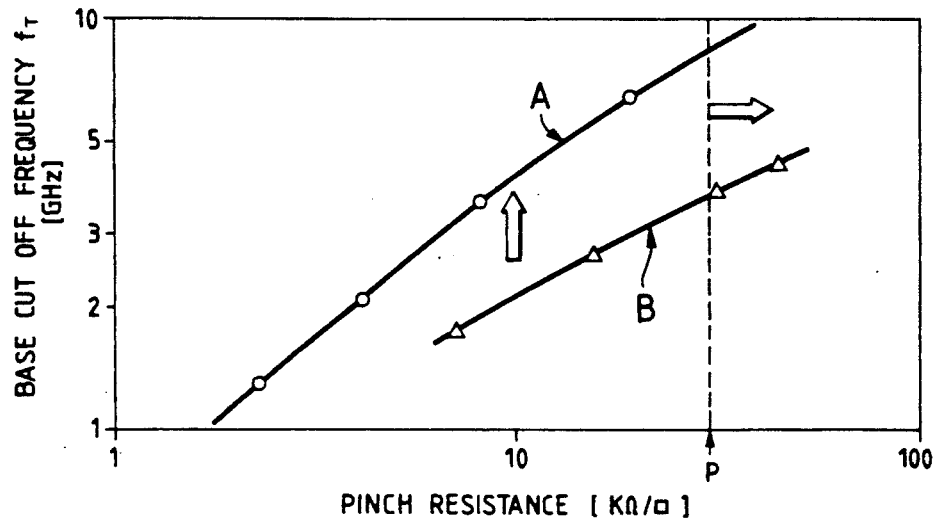

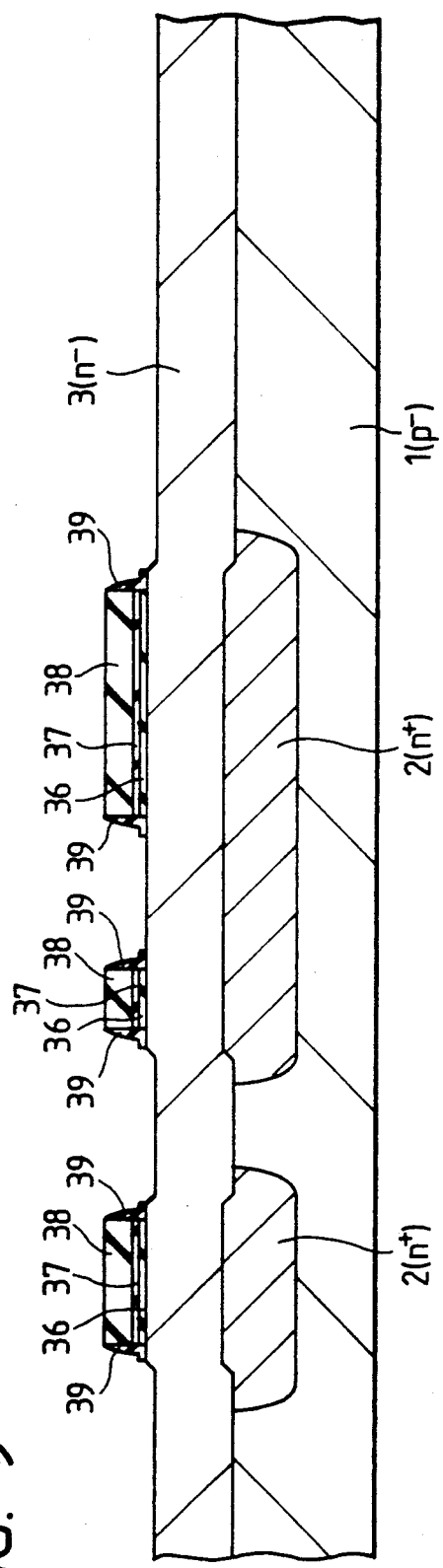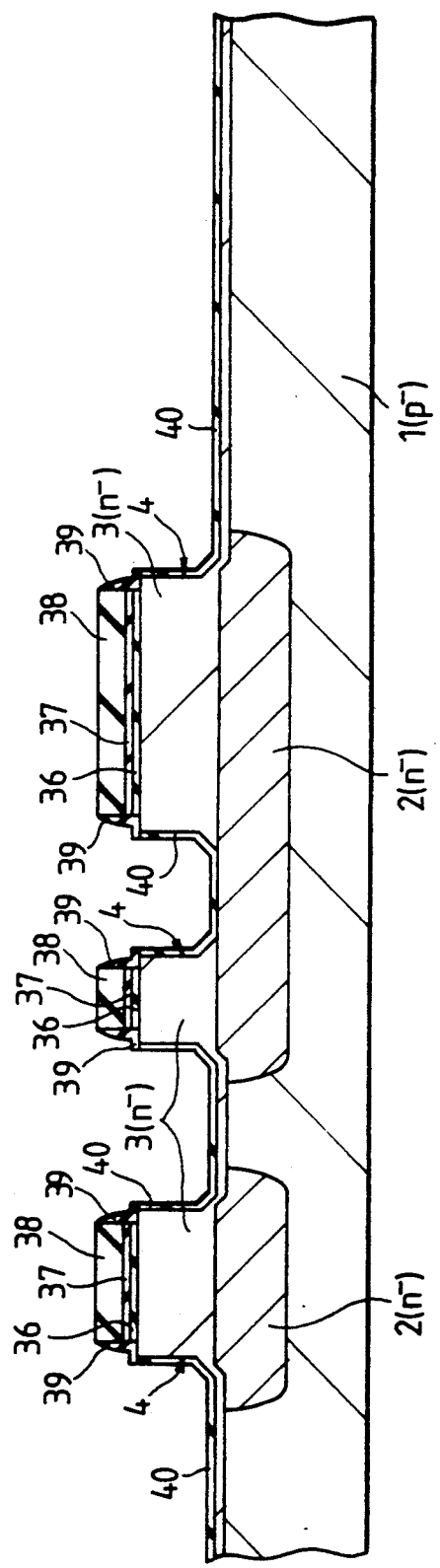

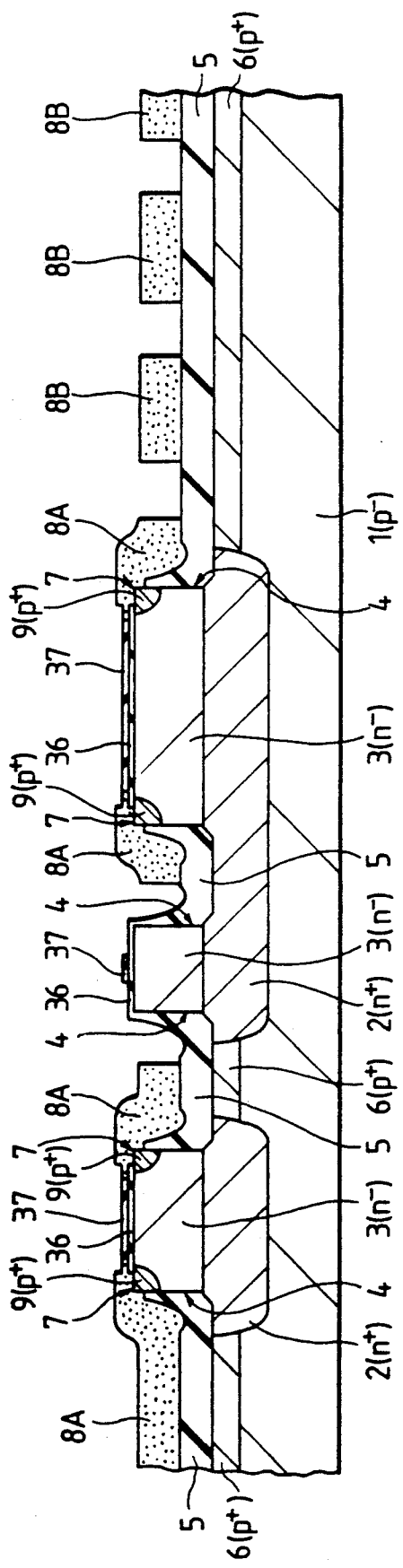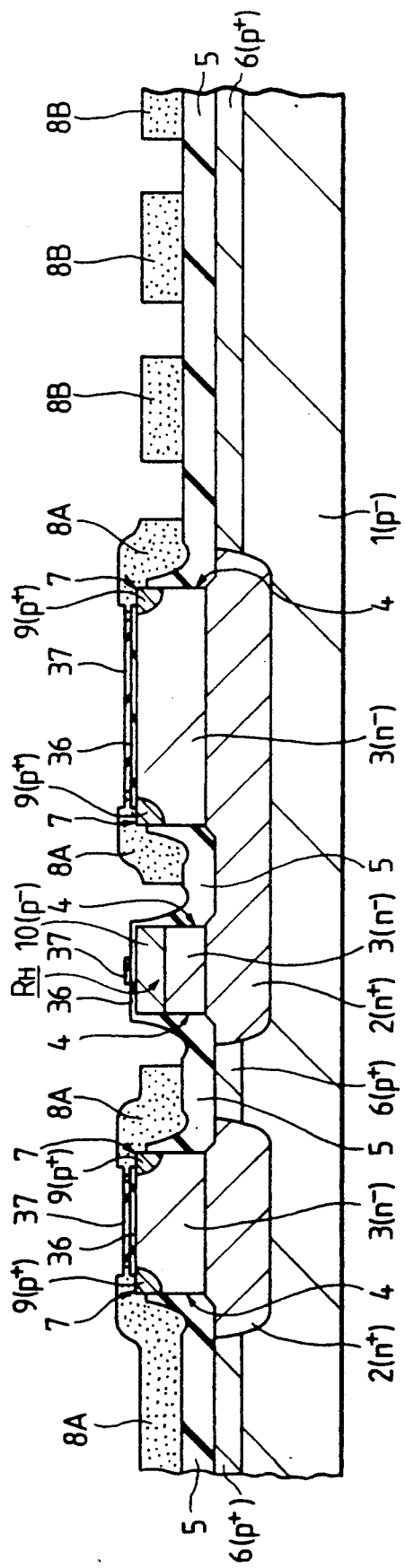

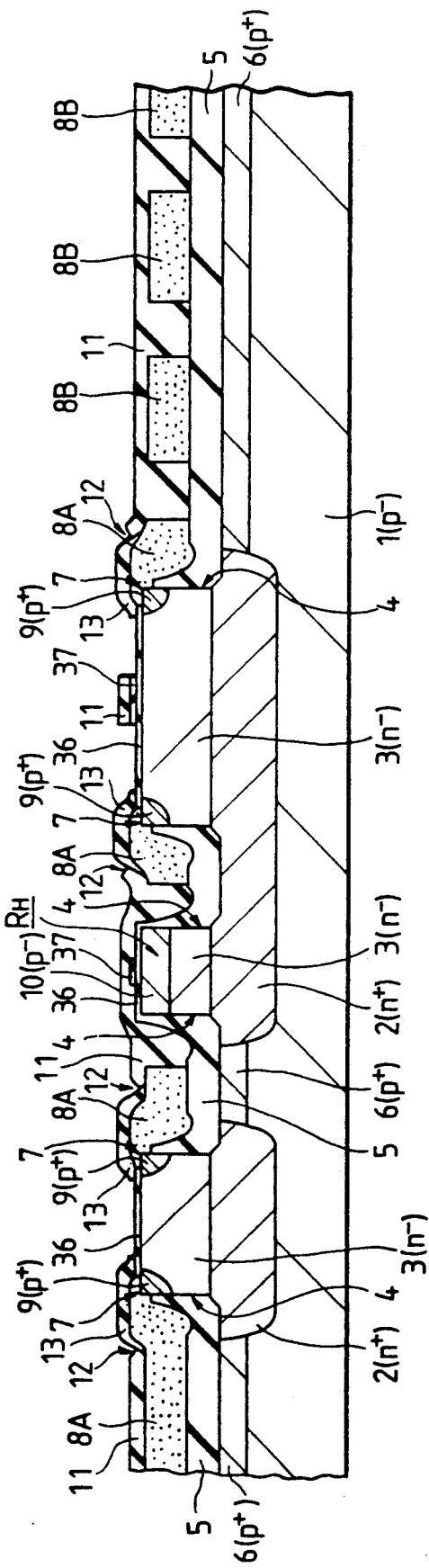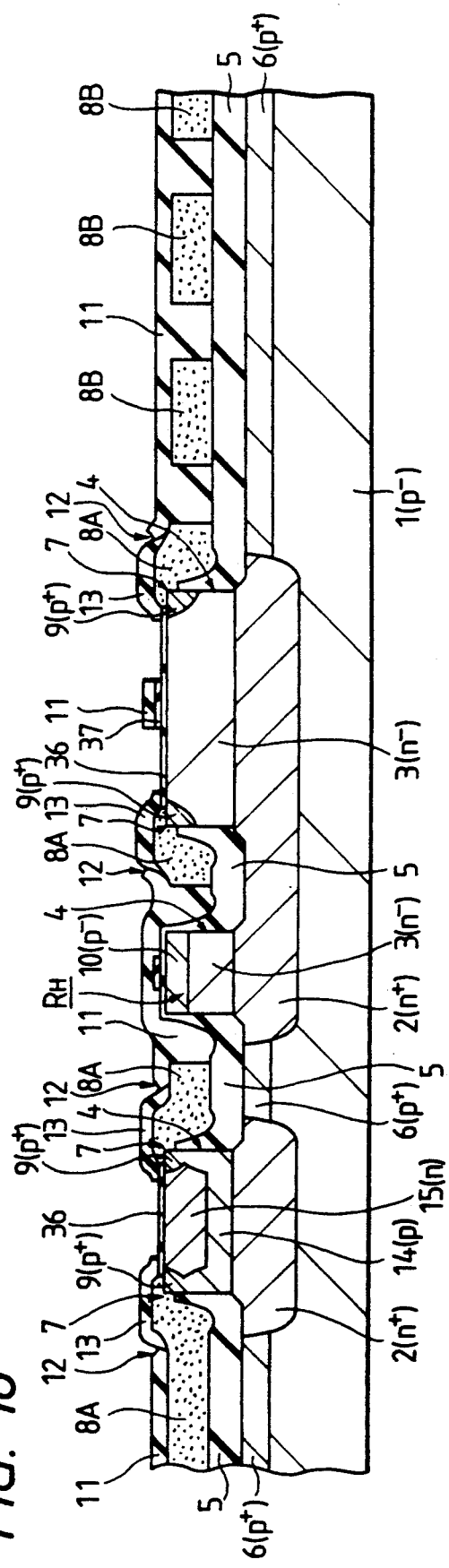

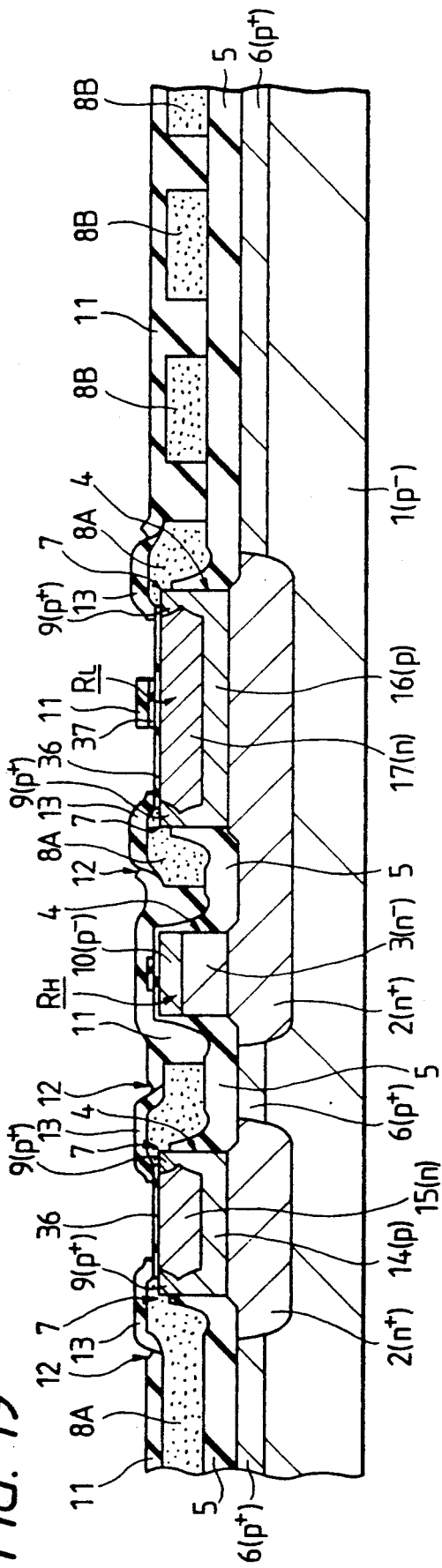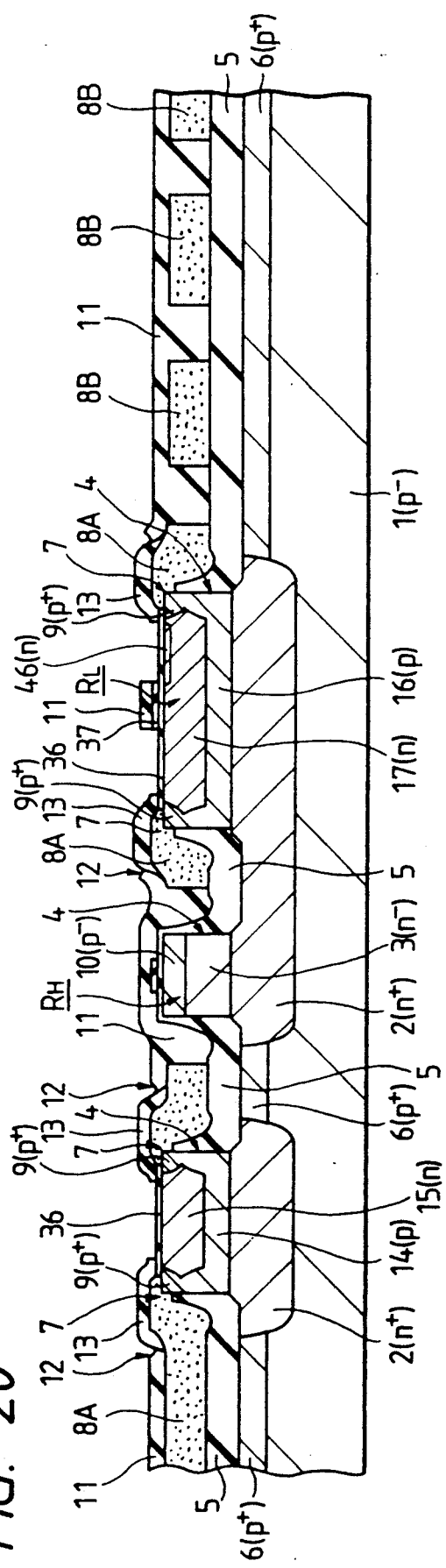

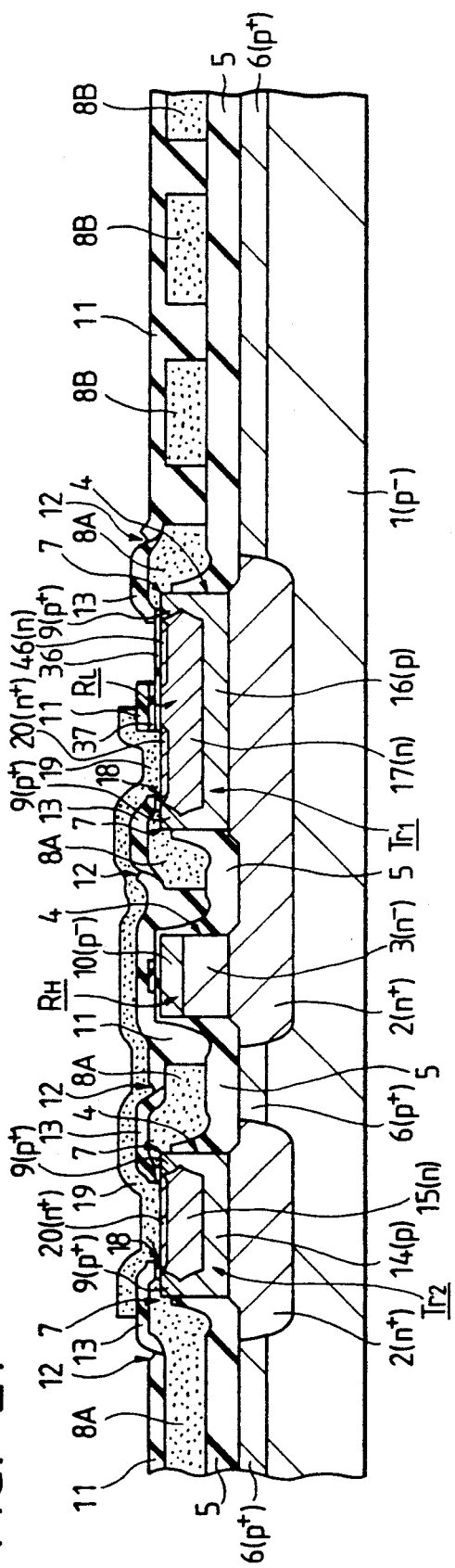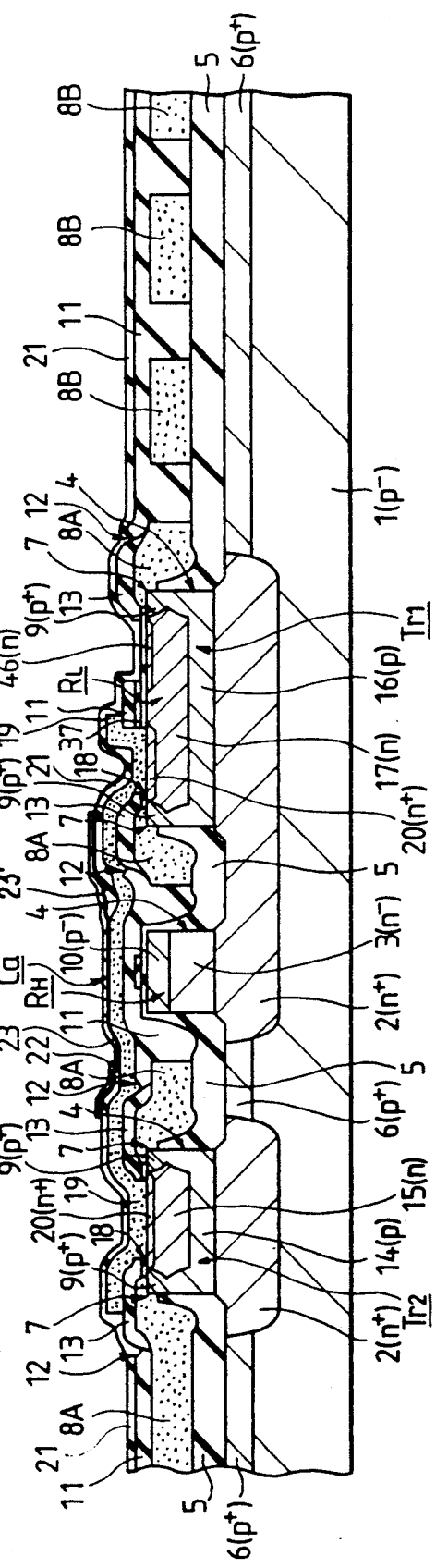

SEMICONDUCTOR INTEGRATED CIRCUIT DEVICE HAVING BIPOLAR MEMORY, AND METHOD OF MANUFACTURING THE SAME

This application is a continuation of application Ser. No. 336,013, filed on Apr. 10, 1989, abandoned.

BACKGROUND OF THE INVENTION

The present invention relates to a semiconductor integrated circuit device, and more particularly to techniques which are effective when applied to a semiconductor integrated circuit device having bipolar transistors.

More concretely, the present invention relates to a semiconductor integrated circuit device having a bipolar memory. In particular, it relates to techniques which are effective when applied to a bipolar-static random access memory (hereinbelow, abbreviated to "SRAM") which includes a Schottky barrier diode element and a resistance element connected in series with the cathode region of the diode element.

A semiconductor integrated circuit device, such as memory LSI or logic LSI, constructed mainly of bipolar transistors tends to be heightened in the density of integration. A bipolar transistor which the inventors are developing adopts a side wall base contact structure (hereinbelow, termed "SICOS") as described in, for example, Japanese Patent Application No. 225738/1984.

The SICOS-bipolar transistor is such that a base region is constructed in a salient (convex) island region of silicon which is formed in an active region, and that a base lead-out electrode is connected to the base region at the side wall of the salient island region. Thus, the SICOS-bipolar transistor has the feature that the occupation area of the base region is reduced in correspondence with the contact area between the base region and the base lead-out electrode, so a higher density of integration can be attained.

In the semiconductor integrated circuit device having the memory LSI, there are employed a forward bipolar transistor which utilizes a transistor action in the forward direction of the SICOS and a reverse bipolar transistor which utilizes a transistor action in the reverse direction of the SICOS (noting that in this specification the term "reverse" transistor will be used to have an identical meaning to the term "inverse transistor" which is frequently used in this art).

The forward bipolar transistor is constructed of a vertical structure in which an emitter region, a base region and a collector region are provided in the direction of the depth of a semiconductor substrate successively from the front surface side of a salient island region formed of an epitaxial layer of single-crystal silicon grown on the principal surface of the semiconductor substrate. The emitter region is constructed of an n-type semiconductor region of high impurity concentration. The base region is constructed of a p-type semiconductor region. The collector region is constructed of an n-type epitaxial layer of low impurity concentration which is provided on a side lying in contact with the base region, and a buried n-type semiconductor region of high impurity concentration which is provided under the n-type epitaxial layer. Such bipolar transistors are used in a peripheral circuit and a logic portion except a resistance switching type memory cell with Schottky barrier diodes (hereinbelow, abbreviated to "SBDs") which the inventors are developing. Since the forward bipolar transistor holds the lightly-doped part (the epitaxial layer) of the collector region in contact with the base region, it has the feature that a p-n junction capacitance which is formed between the base region and the collector region can be lowered, so the operating speed of this transistor can be raised.

The reverse bipolar transistor is constructed of a vertical structure in which a collector region, a base region and an emitter region are provided in the direction of the depth of a salient island region successively from the front surface side thereof. The collector region is constructed of an n-type semiconductor region of high impurity concentration. The base region is constructed of a p-type semiconductor region. The emitter region is constructed of an n-type epitaxial layer of low impurity concentration which is provided on a side lying in contact with the base region, and a buried n-type semiconductor region of high impurity concentration which is provided under the n-type epitaxial layer. Such reverse bipolar transistors constitute the resistance switching type memory cell with SBDs. The reverse bipolar transistor is such that the collector region to serve as the charge storage portion (storage node portion) of the memory cell is constructed on the front surface side of the substrate through the base region. Thus, the reverse bipolar transistor has the feature that the influence of minority carriers created by the entrance of alpha particles into the substrate can be relieved to enhance the soft-error immunity of the transistor against the alpha particles.

The SICOS is a peculiar structure in which the respective operating regions are defined into the vertical structure by the salient island region of silicon. The reverse bipolar transistor is constructed of the simple structure in which the collector region and emitter region of the forward bipolar transistor are replaced with each other. In addition, the respective operating regions of the reverse bipolar transistor are formed by the same manufacturing steps as those of the respective operating regions of the forward bipolar transistor. More specifically, the collector region, base region and emitter region of the reverse bipolar transistor are respectively formed by the same manufacturing steps and at the same impurity concentration distributions as those of the emitter region, base region and collector region of the forward bipolar transistor. The semiconductor integrated circuit device thus constructed has the feature that the number of manufacturing steps can be reduced.

Besides, a bipolar memory to be carried in a semiconductor integrated circuit device which the inventors are developing is an SRAM. Each memory cell in the bipolar memory is constructed of the resistance switching type memory cell with SBDs. This memory cell is configured mainly of the forward bipolar transistors, the reverse bipolar transistors, the SBD elements, low resistance elements and high resistance elements.

Each of the forward bipolar transistor and the reverse bipolar transistor is constructed of the SICOS.

The SBD element is constructed of a cathode region which is formed of an n-type semiconductor region, and a metal film which is held in contact with the front surface of the n-type semiconductor region being the cathode region. The metal film used is, for example, a platinum silicide film.

The low resistance element is constructed of an n-type semiconductor region which is formed to be unitary with the cathode region of the SBD element. The n-type semiconductor region constructing the low resistance element, and the n-type semiconductor region constituting the SBD element are formed in such a way that, at one manufacturing step, an n-type impurity is introduced into the principal surface part of the semiconductor substrate by ion implantation and is subjected to drive-in diffusion. Thus, the low resistance element and the cathode region of the SBD element are formed by the identical manufacturing step, to bring forth the feature that the number of manufacturing steps of the semiconductor integrated circuit device can be reduced.

The high resistance element is constructed of a p-type semiconductor region or an n-type semiconductor region.

SUMMARY OF THE INVENTION

The inventors have found the following problems in the course of the developments of the SICOS-bipolar transistors stated above:

Problem I

In the reverse bipolar transistor, the lightly-doped epitaxial layer of the emitter region lies in contact with the base region. Therefore, the charge amount of holes stored in the epitaxial layer is large, and the base cut-off frequency ($f_T$) of the transistor becomes low. This has led to the problem that the reverse bipolar transistor cannot be operated at fast cycles. With the reverse bipolar transistor which the inventors are developing, the storage charge amount of the holes in the epitaxial layer provides the value of the base cut-off frequency to the extent of 80–90%, and merely a base cut-off frequency on the order of 1–2 [GHz] is attainable.

As the solution of the above problem, it is considered that the thickness of the epitaxial layer is decreased, or that the width of the heavily-doped buried semiconductor region of the emitter region of the reverse bipolar transistor is enlarged by increasing the amount of diffusion of the impurity. The solution, however, incurs inferior characteristics of the semiconductor integrated circuit device, such as degradation in the breakdown voltage between the emitter region and the collector region.

Problem II

In the resistance switching type memory cell with the SBDs, the n-type semiconductor region for constructing the low resistance element and the cathode region of the SBD element has the maximum value (peak value) of the impurity concentration distribution thereof set at a somewhat deep position from the front surface of the substrate. That is, the low resistance element which is used as a bulk resistor has the maximum value of the impurity concentration distribution thereof set in the interior of the substrate in order that the resistance of the low resistance element may be lowered so as not to spoil the switching characteristic of the memory cell at the selection thereof. Consequently, the substrate surface, namely, the cathode region of the SBD element is located at a part at which the rate of change of the impurity concentration is conspicuous and whose impurity concentration values are different from the maximum value of the impurity concentration distribution of the n-type semiconductor region (namely, a part of abrupt impurity profile). The SBD element has its forward voltage $V_f$ provided by the barrier height of the interface between silicon (the n-type semiconductor region) and the metal film formed on the silicon. In this regard, when the impurity concentration of the silicon side changes abruptly as stated above, the amount of the tunneling current of the SBD element changes (disperses). This has led to the problem that the forward voltages of the SBD elements fluctuate conspicuously.

An object of the present invention is to provide, in a semiconductor integrated circuit device having forward and reverse bipolar transistors of SICOS, a technique capable of raising an operating speed.

Another object of the present invention is to provide a technique according to which the first-mentioned object can be accomplished by decreasing the storage charge amount of holes in the reverse bipolar transistor.

Another object of the present invention is to provide a technique according to which the first-mentioned object can be accomplished by decreasing the storage charge amount of holes in the reverse bipolar transistor and reducing the base width of this transistor.

Another object of the present invention is to provide a technique capable of optimizing the reverse bipolar transistor.

Another object of the present invention is to provide a technique capable of decreasing the number of manufacturing steps for accomplishing any of the preceding objects.

Another object of the present invention is to provide, in a semiconductor integrated circuit device having an SBD element and a resistance element connected in series therewith, a technique capable of mitigating the dispersion of the forward voltage of the SBD element and setting the resistance of the resistance element at the optimal value.

Another object of the present invention is to provide a technique capable of enhancing the refractoriness of the SBD element.

The aforementioned and other objects and novel features of the present invention will become apparent from the description of this specification and the accompanying drawings.

Typical aspects of performance of the present invention are briefly summarized as follows:

In a semiconductor integrated circuit device having forward and reverse bipolar transistors of SICOS, the base region of the reverse bipolar transistor to be formed in a salient island region of silicon is constructed deeper than that of the forward bipolar transistor.

Besides, in addition to the above construction in which the base region of the reverse bipolar transistor is deepened, the collector region of the reverse bipolar transistor is constructed deeper than the emitter region of the forward bipolar transistor.

Further, in a semiconductor integrated circuit device having a reverse bipolar transistor of SICOS and a shielded type SBD element, the shielding region of the shielded type SBD element is formed, and simultaneously, the base region of the reverse bipolar transistor is formed.

Further, in a semiconductor integrated circuit device having a reverse bipolar transistor of SICOS and an SBD element, the cathode region of the SBD element is formed, and simultaneously, the collector region of the reverse bipolar transistor is formed.

Further, in a semiconductor integrated circuit device having an SBD element and a resistance element connected in series therewith, the cathode region of the SBD element is constructed of a first semiconductor region of low impurity concentration having a peak value on the front surface side of a substrate, and the resistance element is constructed of a second semiconductor region of high impurity concentration having a peak value at the deeper position of the substrate as compared with the first semiconductor region.

According to the construction described above, the lightly-doped epitaxial layer of the collector region of the forward bipolar transistor lies in contact with the base region of this transistor, so that the capacitance of the p-n junction between the base region and the collector region can be lowered to raise the operating speed of the forward bipolar transistor, and also, the heavily-doped buried semiconductor region of the emitter region of the reverse bipolar transistor lies in contact with the base region of this transistor (or the epitaxial layer of the emitter region is, in effect, thinned), so that the storage charge amount of holes can be decreased to heighten the base cut-off frequency of the reverse bipolar transistor and to raise the operating speed thereof.

Moreover, the base width of the base region of the reverse bipolar transistor can be reduced, so that the base cut-off frequency can be heightened to raise the operating speed of the reverse bipolar transistor.

Moreover, the base region of the reverse bipolar transistor can be formed by the step of forming the shielding region of the SBD element, so that the number of manufacturing steps of the semiconductor integrated circuit device can be diminished.

Moreover, the collector region of the reverse bipolar transistor can be formed by the step of forming the cathode region of the SBD element, so that the number of manufacturing steps of the semiconductor integrated circuit device can be diminished.

Besides, according to the SBD element and the resistance element of the present invention, the cathode region of the SBD element can be constructed of the region in which the rate of change of an impurity concentration distribution is small and which has the low impurity concentration, so that the dispersion of the forward voltage of the SBD element can be mitigated, and the refractoriness of the SBD element can be enhanced, and also, the resistance element can be formed independently of the cathode region of the SBD element, so that the resistance of the resistance element can be set at the optimal value.

BRIEF DESCRIPTION OF THE DRAWINGS

FIGS. 4A thru 4D are diagrams of the impurity concentration distributions of the predetermined parts of the SICOS-bipolar transistors shown in FIG. 3;

FIG. 5 is a graph showing the pinch-resistance-dependencies of the base cutoff frequencies of the SICOS-bipolar transistors;

FIGS. 7 thru 23 are sectional views of essential portions showing the SICOS-bipolar transistors at the respective manufacturing steps thereof.

DESCRIPTION OF THE PREFERRED EMBODIMENTS

Now, there will be described embodiments in which the present invention is applied to a semiconductor integrated circuit device constructed mainly of SICOS-bipolar transistors.

By the way, throughout the drawings for elucidating the embodiments, the same symbols are assigned to portions having the same functions, which shall not be repeatedly explained.

Figure 2:
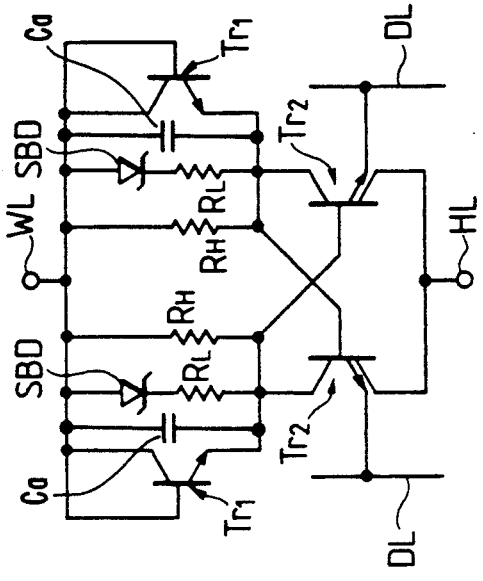
FIG. 2 is an equivalent circuit diagram of a resistance switching type memory cell with SBDs which is constructed of the SICOS-bipolar transistors.

A memory cell in a bipolar-SRAM which is carried in a semiconductor integrated circuit device embodying the present invention, is shown in FIG. 2 (an equivalent circuit diagram).

As shown in FIG. 2, the memory cell of the SRAM is arranged at the intersection part of complementary digit lines DL as well as an information holding line HL and a word line WL. The memory cell which the inventors have developed is constructed of a flip-flop comprising Schottky barrier diodes SBDs, forward bipolar transistors (clamping transistors) $Tr_1$, reverse bipolar transistors $Tr_2$, high resistances $R_H$ and low resistances $R_L$. That is, the memory cell is constructed of a resistance switching type memory cell with SBDs.

Figure 1:
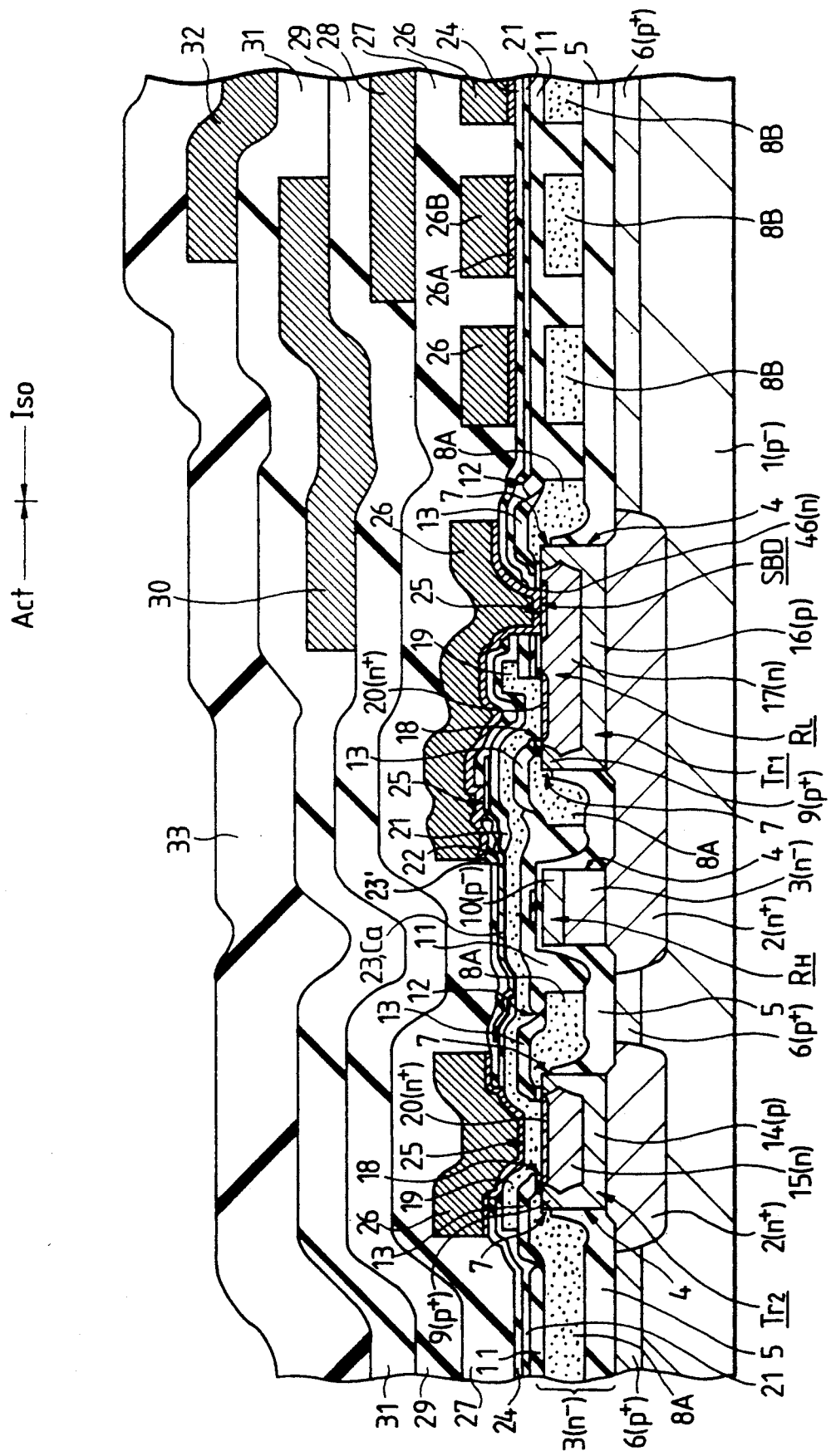
FIG. 1 is a sectional view of the essential portions of SICOS-bipolar transistors embodying the present invention.

The practical constructions of the essential portions of the resistance switching type memory cell with SBDs are shown in FIG. 1 (a sectional view of the essential portions of the memory cell).

The semiconductor integrated circuit device which the inventors have developed is constructed of a four-layer wiring structure though not restricted thereto. The bipolar transistors Tr of an active domain Act for a memory portion and for a peripheral circuit portion and a logic portion, not shown, are chiefly connected by a first layer of wiring 26. Circuits formed within the active domain Act, or circuits formed in different active domains Act are connected by the first layer of wiring 26 and a second layer of wiring 28. The wiring 26 and the wiring 28 are laid so as to extend in an isolation domain Iso. A third layer of wiring 30 and a fourth layer of wiring 32 other than mentioned above are laid so as to chiefly construct signal wiring lines and power source wiring lines.

As shown in FIG. 1, the semiconductor integrated circuit device is mainly composed of a $p^-$-type semiconductor substrate 1 which is made of single-crystal silicon. An $n^-$-type epitaxial layer 3 is stacked on the principal surface of the semiconductor substrate 1.

The resistance switching type memory cell with SBDs is constructed on the principal surface of the semiconductor substrate 1 in the active domain Act. The semiconductor elements, especially the forward bipolar transistor $Tr_1$, reverse bipolar transistor $Tr_2$ and high resistance $R_H$ are electrically isolated by an element isolation region. The element isolation region is mainly constructed of the semiconductor substrate 1, an element isolating insulator film 5 and a $p^+$-type semiconductor region 6. The element isolating insulator film 5 is made of a silicon oxide film which is formed by subjecting the selected area of the principal surface of the semiconductor substrate 1 (or/and the epitaxial layer 3) to a thermal oxidation treatment. The element isolating insulator film 5 is formed at a thickness of about 3000–5000 [Å] lest crystal defects should appear in those parts of the semiconductor substrate 1 and the epitaxial layer 3 which correspond to the angular parts of salient (convex) island regions 4. The element isolating insulator film 5 is formed to be thin as such. The $p^+$-type semiconductor region 6 is provided in the principal surface part of the semiconductor substrate 1 under the element isolating insulator film 5.

The forward bipolar transistor $Tr_1$ is constructed of an n-type collector region, a p-type base region and an n-type emitter region. That is, the forward bipolar transistor $Tr_1$ is constructed of the n-p-n type.

The collector region is configured of a buried $n^+$-type semiconductor region 2 and a collector potential raising $n^+$-type semiconductor region, not shown. The $n^+$-type semiconductor region 2 is interposed between the semiconductor substrate 1 and the epitaxial layer 3. This $n^+$-type semiconductor region 2 is provided in order to lower the collector resistance of the transistor $Tr_1$.

The base region is configured of a $p^+$-type semiconductor region 9 and a p-type semiconductor region 16. The p-type semiconductor region 16 is provided in the principal surface part of the epitaxial layer 3 within the salient island region 4 which is formed of the epitaxial layer 3 in the active domain Act. The $p^+$-type semiconductor region 9 is provided in the principal surface part of the epitaxial layer 3 at the side wall of the salient island region 4, concretely, at the shoulder part thereof.

The emitter region is configured of an n-type semiconductor region 17 and an $n^+$-type semiconductor region 20. The n-type semiconductor region 17 is provided in the principal surface part of the base region (the p-type semiconductor region 16) which is formed in the salient island region 4. The $n^+$-type semiconductor region 20 is provided in the principal surface part of the n-type semiconductor region 17.

Figure 3:
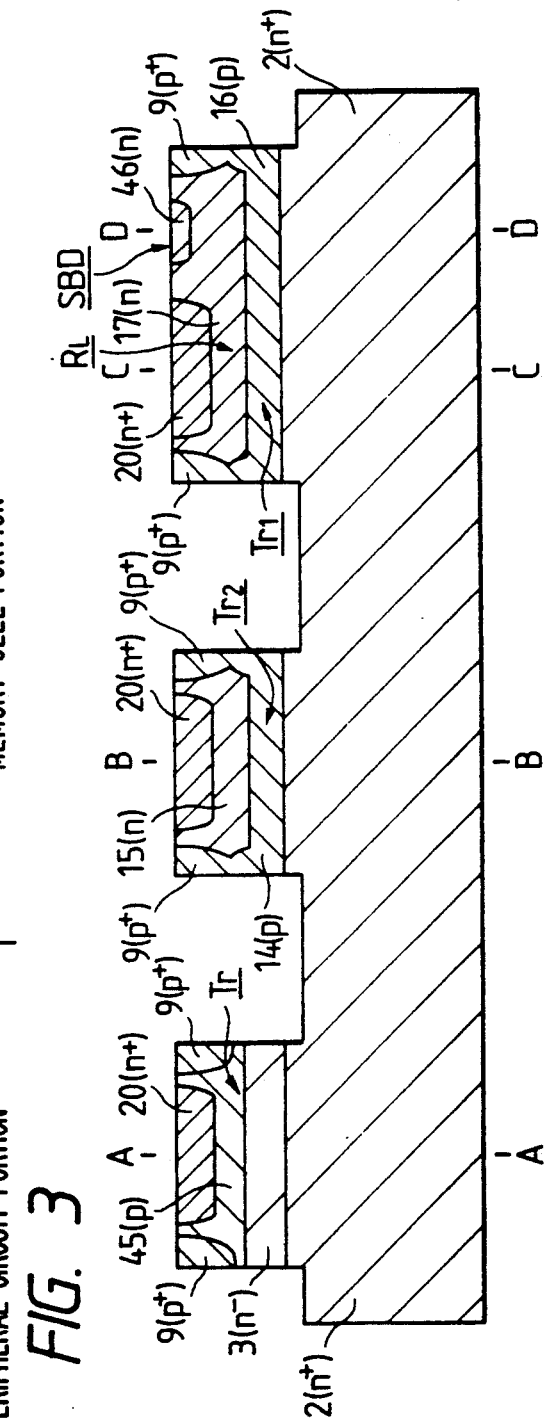
FIG. 3 is a model-like sectional view showing the constructions of the operating regions of the respective SICOS-bipolar transistors.

The constructions of the respective operating regions of the forward bipolar transistor $Tr_1$ are shown in FIG. 3 (a model-like sectional view), while the impurity concentration distributions of the respective operating regions are shown in FIG. 4C (a diagram of the impurity concentration distributions taken along a cutting-plane line C—C in FIG. 3). The buried $n^+$-type semiconductor region 2 constituting the collector region of the forward bipolar transistor $Tr_1$ is constructed at an impurity concentration on the order of, for example, $10^{19}$–$10^{20}$ [atoms/cm$^3$]. As an n-type impurity, Sb is used by way of example. Since the epitaxial layer 3 is grown to a thickness of about 0.6–0.8 [μm], the $n^+$-type semiconductor region 2 is constructed so as to have the maximum value (peak value) of the impurity concentration at a depth of about 0.6–1.4 [μm] from the front surface of the epitaxial layer 3. The p-type semiconductor region 16 constituting the base region is constructed at an impurity concentration on the order of, for example, $10^{17}$–$10^{18}$ [atoms/cm$^3$]. As a p-type impurity, B is used by way of example. The p-type semiconductor region 16 is constructed so as to have the maximum value of the impurity concentration at a depth of about 0.4–0.7 [μm] from the front surface of the epitaxial layer 3. Since this p-type semiconductor region 16 is also used as the shielding region of the Schottky barrier diode SBD (a potential barrier region to minority carriers created by the entrance of alpha particles) as will be described later, it is endowed with the high impurity concentration as the base region. The n-type semiconductor region 17 in the emitter region is constructed at an impurity concentration on the order of, for example, $10^{18}$–$10^{19}$ [atoms/cm$^3$]. As an n-type impurity, P is used by way of example. The n-type semiconductor region 17 is constructed so as to have the maximum value of the impurity concentration at a depth of about 0.2–0.4 [μm] from the front surface of the epitaxial layer 3. Since this n-type semiconductor region 17 is also used as the low resistance $R_L$ and the cathode region of the Schottky barrier diode SBD, it is endowed with the comparatively high impurity concentration. The $n^+$-type semiconductor region 20 in the emitter region is constructed at an impurity concentration on the order of, for example, $10^{20}$–$10^{21}$ [atoms/cm$^3$]. As an n-type impurity, As is used by way of example. The $n^+$-type semiconductor region 20 is constructed so as to have the maximum value of the impurity concentration within the range of a depth of about 0.2 [μm] from the front surface of the epitaxial layer 3.

As shown in FIG. 1, one end of a base lead-out electrode 8A is connected to the $p^+$-type semiconductor region 9 of the base region through a contact hole 7 which is formed in the element isolating insulator film 5 at the side wall of the salient island region 4. The other end of the base lead-out electrode 8A is located on the element isolating insulator film 5 of the element isolation region. Thus, the forward bipolar transistor $Tr_1$ is constructed of the SICOS. The base lead-out electrode 8A is formed of a first-layer polycrystalline silicon film in which a p-type impurity is introduced. The $p^+$-type semiconductor region 9 of the base region is formed in such a way that the p-type impurity introduced in the base lead-out electrode 8A is diffused into the principal surface part of the epitaxial layer 3 at the part of the contact hole 7. That is, the $p^+$-type semiconductor region 9 is formed in self-alignment with the base lead-out electrode 8A. The forward bipolar transistor $Tr_1$ of the SICOS can dispense with the contact area between the base lead-out electrode 8A and the $p^+$-type semiconductor region 9 constituting the base region, in a planar direction, so that it can reduce the occupation area of the base region and can heighten the density of integration.

Although no illustration is made, the first layer of wiring 26 is connected to the base lead-out electrode 8A through a contact hole 25 which is formed in an inter-layer insulator film 24, etc. The wiring 26 is formed of a composite film in which an aluminum film 26B is stacked on a barrier metal film 26A. The barrier metal film 26A is formed of, for example, a TiN film. The aluminum film 26B is doped with Si which prevents alloy spikes, or/and Cu which prevents stress migration.

An emitter lead-out electrode 19 is connected to the $n^+$-type semiconductor region 20 of the emitter region through a contact hole (emitter opening) 18 which is formed by an inter-layer insulator film 13. The emitter lead-out electrode 19 is formed of a second-layer polycrystalline silicon film in which an n-type impurity is introduced. The inter-layer insulator film 13 is constructed of a silicon oxide film which is formed by subjecting the front surface of the base lead-out electrode 8A to a thermal oxidation treatment. The contact hole 18 the opening size of which is defined by the inter-layer insulator film 13, is formed in self-alignment with the base lead-out electrode 8A. In consequence, the emitter lead-out electrode 19 is connected to the $n^+$- type semiconductor region 20 constituting the emitter region in self-alignment with the base lead-out electrode 8A. The n+-type semiconductor region 20 is formed in such a way that, within an extent defined by the contact hole 18, an n-type impurity is introduced into the principal surface part of the n-type semiconductor region 17 through the emitter lead-out electrode 19. That is, the n+-type semiconductor region 20 is formed in self-alignment with the emitter lead-out electrode 19. Likewise to the base lead-out electrode 8A, the emitter lead-out electrode 19 has the wiring 26 connected thereto.

Although not shown, the collector potential raising n+-type semiconductor region of the collector region is provided in the principal surface part of the epitaxial layer 3 of the salient island region 4. Likewise to each of the base region and the emitter region, the collector potential raising n+-type semiconductor region has the wiring 26 connected thereto through the collector lead-out electrode (19).

As shown in FIG. 1, the reverse bipolar transistor $Tr_2$ is constructed of an n-type collector region, a p-type base region and an n-type emitter region. That is, the reverse bipolar transistor $Tr_2$ is constructed of the n-p-n type similarly to the forward bipolar transistor $Tr_1$.

The emitter region is configured of a buried n+-type semiconductor region 2 and an emitter potential raising n+-type semiconductor region, not shown.

The base region is configured of a p+-type semiconductor region 9 and a p-type semiconductor region 14. The p-type semiconductor region 14 is provided in the principal surface part of the epitaxial layer 3 within a salient island region 4. The p+-type semiconductor region 9 is provided in the principal surface part of the epitaxial layer 3 at the shoulder part of the salient island region 4.

The collector region is configured of an n-type semiconductor region 15 and an n+-type semiconductor region 20. The n-type semiconductor region 15 is provided in the principal surface part of the base region (the p-type semiconductor region 14) which is formed in the salient island region 4. The n+-type semiconductor region 20 is provided in the principal surface part of the n-type semiconductor region 15.

The constructions of the respective operating regions of the reverse bipolar transistor $Tr_2$ are shown in FIG. 3, while the impurity concentration distributions of the respective operating regions are shown in FIG. 4B (a diagram of the impurity concentration distributions taken along a cutting-plane line B—B in FIG. 3). The reverse bipolar transistor $Tr_2$ is constructed of a structure in which the emitter region and the collector region of the forward bipolar transistor $Tr_1$ are, in effect, replaced with each other. The buried n+-type semiconductor region 2 constituting the emitter region of the reverse bipolar transistor $Tr_2$ is constructed at an impurity concentration on the order of, for example, $10^{19}$–$10^{20}$ [atoms/cm$^3$]. As an n-type impurity, Sb is used by way of example. The n+-type semiconductor region 2 is constructed so as to have the maximum value of the impurity concentration at a depth of about 0.6–1.4 [μm] from the front surface of the epitaxial layer 3. That is, the emitter region of the reverse bipolar transistor $Tr_2$ is endowed with the impurity concentration which is identical or substantially equal to that of the collector region of the forward bipolar transistor $Tr_1$. The p-type semiconductor region 14 constituting the base region is constructed at an impurity concentration on the order of, for example, $10^{17}$–$10^{18}$ [atoms/cm$^3$]. As a p-type impurity, B is used by way of example. The p-type semiconductor region 14 is constructed so as to have the maximum value of the impurity concentration at a depth of about 0.4–0.7 [μm] from the front surface of the epitaxial layer 3. Since this p-type semiconductor region 14 is also used as a shielding region for shielding the collector region of the reverse bipolar transistor $Tr_2$ (a potential barrier region to minority carriers created by the entrance of alpha particles), it is endowed with the high impurity concentration as the base region. That is, the base region of the reverse bipolar transistor $Tr_2$ is endowed with the impurity concentration which is identical or substantially equal to that of the base region of the forward bipolar transistor $Tr_1$. The n-type semiconductor region 15 in the collector region is constructed at an impurity concentration on the order of, for example, $10^{18}$–$10^{19}$ [atoms/cm$^3$]. As an n-type impurity, P is used by way of example. The n-type semiconductor region 15 is constructed so as to have the maximum value of the impurity concentration at a depth of about 0.2–0.4 [μm] from the front surface of the epitaxial layer 3. The n+-type semiconductor region 20 in the collector region is constructed at an impurity concentration on the order of, for example, $10^{20}$–$10^{21}$ [atoms/cm$^3$]. As an n-type impurity, As is used by way of example. The n+-type semiconductor region 20 is constructed so as to have the maximum value of the impurity concentration within the range of a depth of about 0.2 [μm] from the front surface of the epitaxial layer 3. That is, the collector region (the respective regions 15 and 20) of the reverse bipolar transistor $Tr_2$ is endowed with the impurity concentration which is identical or substantially equal to that of the emitter region (the respective regions 17 and 20) of the forward bipolar transistor $Tr_1$. The collector region of the reverse bipolar transistor $Tr_2$ is used as the information storage portion (storage node portion) of the resistance switching type memory cell with the SBDs.

A forward bipolar transistor Tr shown on the left side of FIG. 3 is not depicted in FIG. 1, and such transistors are chiefly arranged in the peripheral circuit and the logic portion other than the memory cell portion. The forward bipolar transistor Tr is constructed of an n-type collector region, a p-type base region and an n-type emitter region, and is accordingly constructed of the n-p-n type. This forward bipolar transistor Tr is formed of the SICOS.

The collector region is configured of a buried n+-type semiconductor region 2, an n−-type epitaxial layer 3 and a collector potential raising n+-type semiconductor region, not shown.

The base region is configured of a p+-type semiconductor region 9 and a p-type semiconductor region 45. The p-type semiconductor region 45 is provided in the principal surface part of the epitaxial layer 3 within a salient island region 4. The p+-type semiconductor region 9 is provided in the principal surface part of the epitaxial layer 3 at the side wall of the salient island region 4, concretely, at the shoulder part thereof.

The emitter region is configured of an n+-type semiconductor region 20. The n+-type semiconductor region 20 is provided in the principal surface part of the base region (the p-type semiconductor region 45) which is formed in the salient island region 4.

The impurity concentration distributions of the respective operating regions of the forward bipolar transistor Tr are shown in FIG. 4A (a diagram of the impurity concentration distributions taken along a cutting-plane line A—A in FIG. 3).

The buried n+-type semiconductor region 2 constituting the collector region of the forward bipolar transistor Tr is constructed at an impurity concentration which is identical or substantially equal to that of the collector region of the forward bipolar transistor Tr$_1$ or the emitter region of the reverse bipolar transistor Tr$_2$. The epitaxial layer 3 is interposed between the p-type semiconductor region 45 constituting the base region and the buried n+-type semiconductor region 2 constituting the collector region. The epitaxial layer 3 is constructed at an impurity concentration on the order of, for example, $10^{15}$–$10^{16}$ [atoms/cm$^3$]. This epitaxial layer 3 is constructed within the range of a thickness of about 0.4–0.7 [μm]. The p-type semiconductor region 45 constituting the base region is constructed at an impurity concentration on the order of, for example, $10^{17}$–$10^{18}$ [atoms/cm$^3$]. As a p-type impurity, B is used by way of example. The p-type semiconductor region 45 is constructed so as to have the maximum value of the impurity concentration at a depth of about 0.3–0.4 [μm] from the front surface of the epitaxial layer 3. The n+-type semiconductor region 20 serving as the emitter region is constructed at an impurity concentration on the order of, for example, $10^{20}$–$10^{21}$ [atoms/cm$^3$]. As an n-type impurity, As is used by way of example. The n+-type semiconductor region 20 is constructed so as to have the maximum value of the impurity concentration within the range of a depth of about 0.2 [μm] from the front surface of the p-type semiconductor region 45 constituting the base region.

The forward bipolar transistor Tr applied outside the memory cell is such that the p-type semiconductor region 45 constituting the base region defines a shallow p-n junction, and that the bottom surface of the p-type semiconductor region 45 is held in contact with the n-type epitaxial layer 3 of the low impurity concentration. That is, the p-type semiconductor region 45 and the epitaxial layer 3 construct a p-n junction portion having the low impurity concentration.

In contrast, the reverse bipolar transistor Tr$_2$ constructs its base region by the use of the p-type semiconductor region 14 the p-n junction of which is deeper than that of the p-type semiconductor region 45 constituting the base region of the forward bipolar transistor Tr. The p-type semiconductor region 14 is constructed so that the distance between the base region and the buried n+-type semiconductor region 2 may be shortened to diminish the vertical dimension of the epitaxial layer 3, or that the epitaxial layer 3 may be, in effect, done away with to bring the base region into direct contact with the buried n+-type semiconductor region 2. The formula of the base cutoff frequency f$_T$ of the reverse bipolar transistor Tr$_2$ governing the operating speed thereof is given by the following equation <1>:

$$\frac{1}{2\pi f_T} = \frac{Q}{I_c} + \frac{W_B^2}{\eta D} \qquad <1>$$

where
Q: storage charge amount of holes,
W$_B$: base width,
η: charge density,
D: diffusion coefficient.

The base cutoff frequency f$_T$ depends upon the storage charge amount Q of holes in the epitaxial layer 3. Regarding the reverse bipolar transistor Tr$_2$, however, the first term of Eq. <1> is negligible for the reason that the epitaxial layer 3 is virtually done away with to hold the base region (the p-type semiconductor region 14) and the buried n+-type semiconductor region 2 in direct contact, thereby to define a p-n junction of the high impurity concentration. Since the first term of Eq. <1> governs about 80–90% of the magnitude of the base cutoff frequency f$_T$, this base cutoff frequency f$_T$ can be rendered high.

In addition, the reverse bipolar transistor Tr$_2$ constructs its collector region by the use of the n-type semiconductor region 15 (and the n+-type semiconductor region 20) the p-n junction of which is deeper than that of the n+-type semiconductor region 20 constructing the emitter region of the forward bipolar transistor Tr. The n-type semiconductor region 15 is constructed deep in correspondence with the deep construction of the p-type semiconductor region 14 constituting the base region, so as to reduce the base width (the widthwise dimension of the p-type semiconductor region 14). Thus, the base cutoff frequency f$_T$ is governed by the base width W$_B$ as indicated by Eq. <1> and can be rendered high by deepening the collector region.

The wiring 26 is connected to the p+-type semiconductor region 9 of the base region of the reverse bipolar transistor Tr$_2$ through a base lead-out electrode 8A as in the case of the forward bipolar transistor Tr$_1$. That is, the reverse bipolar transistor Tr$_2$ is constructed of the SICOS. The emitter potential raising n+-type semiconductor region, not shown, of the emitter region has the wiring 26 connected thereto through an emitter lead-out electrode (19). The n+-type semiconductor region 20 of the collector region has the wiring 26 connected thereto through the collector lead-out electrode 19.

In this manner, in the semiconductor integrated circuit device having the forward bipolar transistors Tr (transistors outside the memory cells) and reverse bipolar transistors Tr$_2$ (memory cells) of the SICOS, the base region (p-type semiconductor region 14) of the reverse bipolar transistor Tr$_2$ is constructed deeper as compared with the base region (p-type semiconductor region 45) of the forward bipolar transistor Tr, whereby the lightly-doped epitaxial layer 3 of the collector region lies in contact with the base region of the forward bipolar transistor Tr, so that the capacitance of the p-n junction between the base region and the collector region can be lowered to attain a raised operating speed of the forward bipolar transistor Tr, and simultaneously, the heavily-doped buried semiconductor region 2 of the emitter region lies in contact with the base region of the reverse bipolar transistor Tr$_2$ (or the epitaxial layer 3 thins), so that the base cutoff frequency f$_T$ can be heightened owing to the reduction of the storage charge amount Q of holes, to attain a raised operating speed of the reverse bipolar transistor Tr$_2$.

Moreover, in addition to the above construction, the collector region (n-type semiconductor region 15) of the reverse bipolar transistor Tr$_2$ is constructed deeper as compared with the emitter region (n+-type semiconductor region 20) of the forward bipolar transistor Tr, whereby in addition to the effects mentioned above, the base width of the base region (p-type semiconductor region 14) of the reverse bipolar transistor Tr$_2$ can be reduced, so that the base cutoff frequency f$_T$ can be further heightened to attain a raised operating speed of the reverse bipolar transistor Tr$_2$.

FIG. 5 (a graph showing the pinch-resistance-dependencies of the base cutoff frequencies $f_T$) illustrates the base cutoff frequency $f_T$ (solid line A) of the reverse bipolar transistor $Tr_2$ stated before, and the base cutoff frequency $f_T$ (solid line B) in the case where the forward bipolar transistor Tr is utilized as a reverse bipolar transistor. As illustrated in FIG. 5, the base cutoff frequency $f_T$ of the reverse bipolar transistor $Tr_2$ can be rendered approximately double as high as that of the prior-art reverse bipolar transistor (Tr). That is, the reverse bipolar transistor $Tr_2$ can realize a base cutoff frequency $f_T$ of about 4–8 [GHz] and can therefore be operated at fast cycles. Incidentally, in FIG. 5, a domain whose pinch resistance exceeds about 30 [kΩ/☐] (a domain beyond a point P) is a domain where punch-through takes place.

As shown in FIG. 1, the Schottky barrier diode SBD is constructed of the n-type semiconductor region 17 (a cathode region) which is constructed to be unitary with the emitter region of the forward bipolar transistor of the memory cell, and a platinum silicide film (anode region), not shown, which is formed on the principal surface of the n-type semiconductor region 17. In effect, the cathode region of the Schottky barrier diode SBD is configured of an n-type semiconductor region 46 which is provided on the front surface side of the n-type semiconductor region 17, and the anode region is configured of the platinum silicide film which is formed on the principal surface of the n-type semiconductor region 46. As shown in FIG. 3 and FIG. 4D (a diagram of impurity concentration distributions taken along a cutting-plane line D—D in FIG. 3), the n-type semiconductor region 46 is constructed so as to have the maximum value of the impurity concentration thereof on the front surface side of the epitaxial layer 3 with respect to the n-type semiconductor region 17 and to be smaller in the maximum value of the impurity concentration than the n-type semiconductor region 17. A part where the impurity concentration of the n-type semiconductor region 46 becomes the maximum, lies in the platinum silicide film (in a silified region). The n-type semiconductor region 46 is constructed at an impurity concentration on the order of $10^{18}$ [atoms/cm$^3$] or less, concretely, at an impurity concentration of $1.25 \times 10^{18}$ [atoms/cm$^3$] or less. In this embodiment, the n-type semiconductor region 46 is endowed with an impurity concentration on the order of $10^{17}$ [atoms/cm$^3$]. Besides, the n-type semiconductor region 46 is constructed so as to have the maximum value of the impurity concentration within a range down to 0.01 [μm] from the front surface of the n-type semiconductor region 17.

Figure 6A:
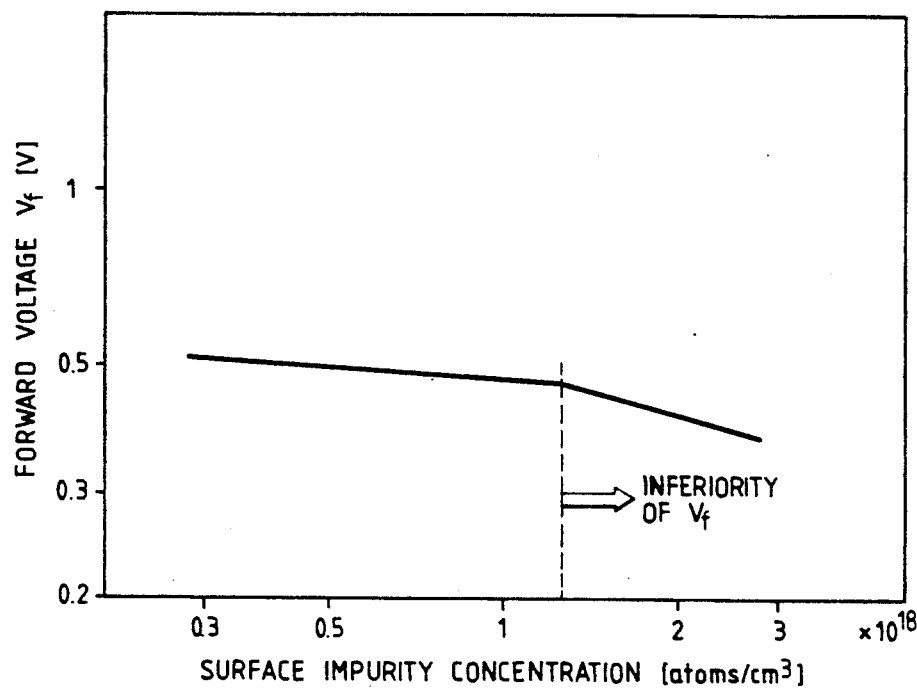
FIG. 6A is a graph showing the relationship between the surface impurity concentration and the forward voltage $V_f$ of the SBD element of the memory cell.
Figure 6B:
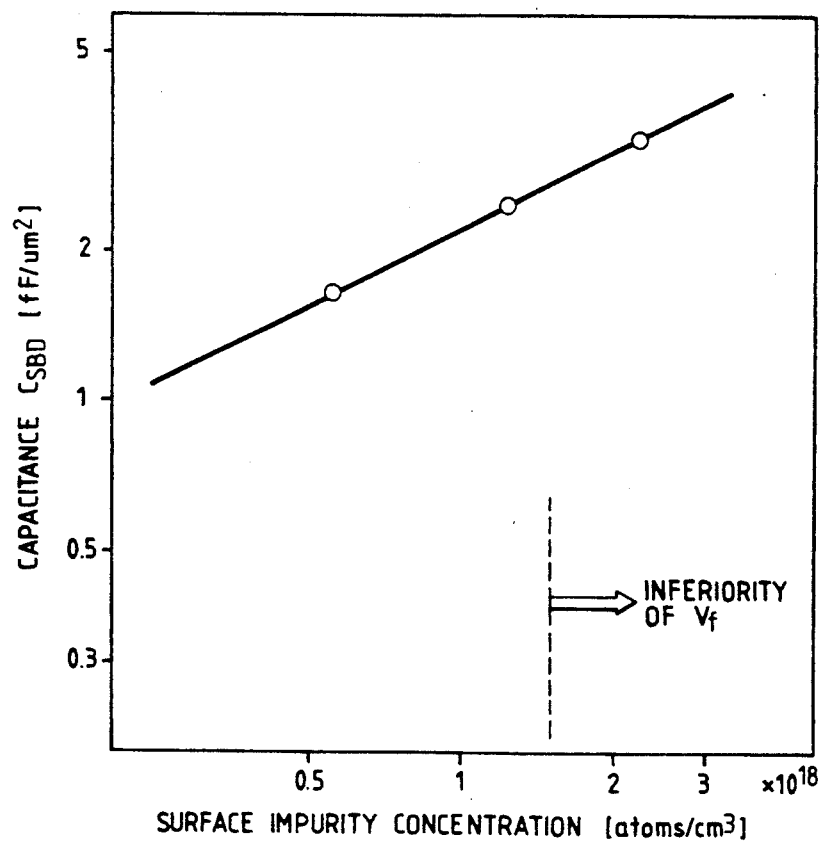
FIG. 6B is a graph showing the relationship between the surface impurity concentration and the capacitance of the SBD element of the memory cell.

As illustrated in FIG. 6A (a graph showing the relationship between the surface impurity concentration and the forward voltage $V_f$ of the SBD), the Schottky barrier diode SBD is such that, when the impurity concentration of the front surface thereof exceeds $1.25 \times 10^{18}$ [atoms/cm$^3$], the forward voltage $V_f$ becomes inferior drastically due to annealing. Besides, as illustrated in FIG. 6B (a graph showing the relationship between the surface impurity concentration and the capacitance of the SBD), the Schottky barrier diode SBD is such that the capacitance $C_{SBD}$ increases as the impurity concentration of the front surface increases, but that the inferiority of the forward voltage $V_f$ attributed to the annealing is drastical when the value of $1.25 \times 10^{18}$ [atoms/cm$^3$] is exceeded.

Accordingly, the Schottky barrier diode SBD has its front surface set at the low impurity concentration of or below $1.25 \times 10^{18}$ [atoms/cm$^3$] and has the maximum value of the impurity concentration established at its front surface in order to moderate the rate of change of the impurity concentration. With the Schottky barrier diode SBD thus constructed, the cathode region is formed at the low impurity concentration, whereby the forward voltage $V_f$ can be prevented from becoming inferior due to the annealing, and the rate of change of the impurity concentration is reduced, whereby a barrier height at the interface between silicon (the semiconductor region 46) and metal (the platinum silicide film) can be stabilized to stabilize a tunneling current flowing through the interface and to reduce the rate of change of the forward voltage $V_f$.

The Schottky barrier diode SBD is constructed of a shielded structure. More specifically, the n-type semiconductor region 17 of the Schottky barrier diode SBD is shielded by the p-type semiconductor region 16 and the p$^+$-type semiconductor region 9 which construct the base region of the forward bipolar transistor $Tr_1$. The shielding region is a potential barrier region to minority carriers which are created by the entrance of alpha particles.

The Schottky barrier diode SBD is connected to the collector terminal (information storage portion) of the reverse bipolar transistor $Tr_2$ through the low resistance $R_L$.

The low resistance $R_L$ of the memory cell resistors is constructed of the n-type semiconductor region 17 which constitutes the emitter region of the forward bipolar transistor $Tr_1$. Since, as stated before, the n-type semiconductor region 17 of the low resistance $R_L$ is endowed with the same conductivity type as that of the n-type semiconductor region 46 being the cathode region of the Schottky barrier diode SBD, the low resistance $R_L$ and the Schottky barrier diode SBD are connected in series. The n-type semiconductor region 17 of the low resistance $R_L$ is constructed at the same impurity concentration as that of the n-type semiconductor region 17 of the forward bipolar transistor $Tr_1$ so as to exhibit a low resistance value.

In this manner, in the semiconductor integrated circuit device having the low resistance $R_L$ which is connected in series with the cathode region of the Schottky barrier diode SBD, the cathode region of the Schottky barrier diode SBD is constructed of the n-type semiconductor region 46 at the low impurity concentration having the maximum value on the side of the front surface of the substrate, and the low resistance $R_L$ is constructed of the n-type semiconductor region 17 at the high impurity concentration having the maximum value at the deeper position of the substrate surface than in the n-type semiconductor region 46, whereby the Schottky barrier diode SBD can be constructed in the region in which the rate of change of the impurity concentration distribution is small, so that the characteristics of the Schottky barrier diode SBD can be enhanced owing to the mitigation of the dispersion of the forward voltage $V_f$ and the enhancement of refractoriness, and independently of this effect, the value of the low resistance $R_L$ can be optimally set at a sufficiently low value.

The high resistance $R_H$ of the memory cell resistors is constructed of a p$^-$-type semiconductor region 10. The p$^-$-type semiconductor region 10 is provided in the principal surface part of the epitaxial layer 3 of a salient island region 4.

Further, the memory cell is provided with a capacitor Ca. The capacitor Ca is constructed of a stacked structure in which a lower-layer electrode 19, a dielectric film 23' and an upper-layer electrode 23 are successively stacked. The lower-layer electrode 19 is formed of a polycrystalline silicon film which is the same layer as the emitter lead-out electrode 19. The dielectric film 23' is formed of, for example, a tantalum oxide ($Ta_2O_5$) film. The upper-layer electrode 23 is formed of, for example, a refractory metal ($MoSi_2$) film. The dielectric film 23' is constructed in the same pattern as that of the upper-layer electrode 23.

The second layer of wiring 28 is extended over the first layer of wiring 26 with an inter-layer insulator film 27 interposed therebetween. The third layer of wiring 30 is extended over the second layer of wiring 28 with an inter-layer insulator film 29 interposed therebetween. The fourth layer of wiring 32 is extended over the third layer of wiring 30 with an inter-layer insulator film 31 interposed therebetween. Each of the second layer of wiring 28, the third layer of wiring 30 and the fourth layer of wiring 32 is formed of an aluminum film, or an aluminum film doped with Si or/and Cu. The fourth layer of wiring 32 is overlaid with a passivation film 33.

In the isolation domain Iso, dummy saliences 8B are provided among the salient island regions 4, namely, on the element isolating insulator film serving as the element isolating region, as shown in FIG. 1. The dummy saliences 8B are constructed of the same conductor layer as that of both the base lead-out electrode 8A of the forward bipolar transistor $Tr_1$ and the base lead-out electrode 8A of the reverse bipolar transistor $Tr_2$. These dummy saliences 8B are held in agreement (synchronism) with the arrangement pattern of the overlying first-layer wiring 26. Each of the dummy saliences 8B is constructed into a planar shape of regular square, and pluralities of such dummy saliences are arranged regularly in row and column directions in meshed fashion. With the dummy saliences 8B thus constructed, level differences to be developed by the semiconductor elements and the electrodes can be alleviated to flatten the front surface of the inter-layer insulator film 24, so that the step coverage of the wiring 26 can be enhanced to improve the electrical reliability thereof, and simultaneously, parasitic capacitances can be deliberately formed between the wiring 26 and the semiconductor substrate 1 to reduce parasitic capacitances additional to the wiring 26, so that the signal transmission speed of the wiring 26 can be raised to enhance the operating speed of the semiconductor integrated circuit device.

Now, a practicable method of manufacturing the semiconductor integrated circuit device will be briefly described with reference to FIGS. 7 thru 23 (sectional views of essential portions showing respective manufacturing steps).

First, a $p^-$-type semiconductor substrate 1 made of single-crystal silicon is prepared.

Subsequently, in an isolation domain Iso and Act, an impurity introducing mask 35 is formed on the principal surface of the semiconductor substrate 1. The impurity introducing mask 35 is constructed of a silicon oxide film which is formed by subjecting the selected area of the principal surface of the semiconductor substrate 1 to a thermal oxidation treatment.

Figure 7:
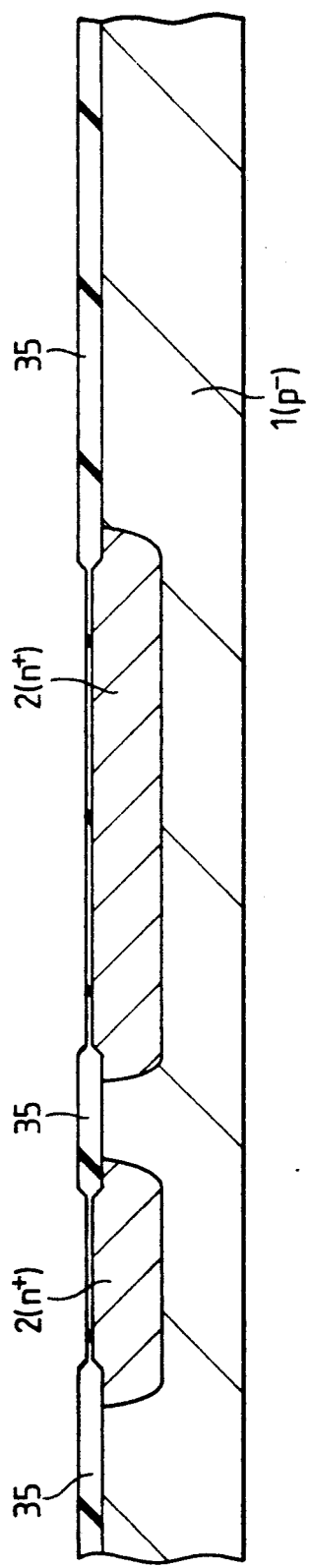

Subsequently, an n-type impurity, for example, Sb (or P or As) is introduced into the principal surface parts of the semiconductor substrate 1 by the use of the impurity introducing mask 35, whereby buried $n^+$-type semiconductor regions 2 are formed as shown in FIG. 7. The n-type impurity is introduced by, for example, thermal diffusion.

Figure 8:
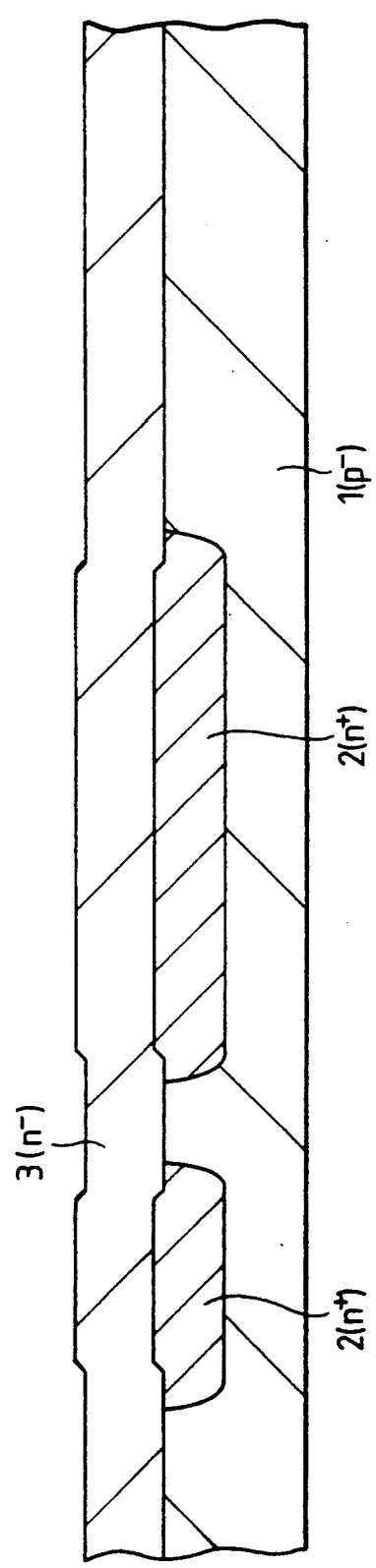

Next, the impurity introducing mask 35 and other silicon oxide films on the principal surface of the semiconductor substrate 1 are removed. Thereafter, as shown in FIG. 8, an $n^-$-type epitaxial layer 3 is grown on the whole area of the principal surface of the semiconductor substrate 1. The epitaxial layer 3 is formed at a thickness of, for example, about 0.6–0.8 [$\mu$m].

Next, in the semiconductor element forming areas of the active domain Act, masks 36, 37 and 38 which are successively stacked on the principal surface of the epitaxial layer 3 are respectively formed. By way of example, the mask 36 is constructed of a silicon oxide film which is formed by subjecting the front surface of the epitaxial layer 3 to a thermal oxidation treatment. The mask 37 is formed on the mask 36, and is chiefly used as an oxidation-impermeable mask. This mask 37 is constructed of a silicon nitride film deposited by, for example, CVD or sputtering, and it is formed at a thickness of about 800–1200 [Å]. The mask 36 is provided for the purposes of relieving stresses to appear between the semiconductor substrate 1 and the mask 7, etc., and it is formed at a thickness of, for example, 400–600 [Å]. The mask 38 is formed on the mask 37, and it is chiefly used as an etching mask. This mask 38 is constructed of a silicon oxide film deposited by, for example, CVD, and it is formed at a thickness of about 7000–8000 [Å]. These masks 36, 37 and 38 are patterned (in the stacked state) successively from the top layer, and are shaped into the same pattern.

At the next step, masks 39 are formed on the side walls of the respective masks 36, 37 and 38 as shown in FIG. 9. The masks 39 are chiefly used as etching and oxidation-impermeable masks. By way of example, the masks 39 can be formed in such a way that a silicon nitride film and a polycrystalline silicon film are respectively stacked in succession and are thereafter subjected to anisotropic etching such as RIE. The silicon nitride film is chiefly used for enduring a thermal oxidation treatment, while the polycrystalline silicon film is used for enhancing the step coverage of the silicon nitride film.

Subsequently, using the masks 38 and 39 mainly, those parts of the front surface of the epitaxial layer 3 which lie in the isolation domain Iso and among the semiconductor elements of the active domain Act are removed by etching, so as to form salient island regions 4 which are the protrusions of the epitaxial layer 3. As the etching, anisotropic etching is mainly carried out in order to heighten the accuracy of finishing. At the final stage, isotropic etching is carried out in order to moderate the abrupt shapes of the corner parts of the salient island regions 4.

Subsequently, as shown in FIG. 10, a silicon oxide film 40 is formed on the exposed part of the front surface of the epitaxial layer 3 by employing the mask 39 mainly. The silicon oxide film 40 is formed by subjecting the front surface of the epitaxial layer 3 to a thermal oxidation treatment. This silicon oxide film 40 is provided in order that damages ascribable to the foregoing etching operations performed for forming the salient island regions 4 may be eliminated from the front surface of the epitaxial layer 3.

At the next step, the silicon oxide film 40 and the masks 39 are respectively removed in succession.

At the next step, masks 41 are formed on the side walls of the respective masks 36, 37 and 38 and the side walls of the salient island regions 4 (the front surface of the epitaxial layer 3). The masks 41 are chiefly used for enduring a thermal oxidation treatment. By way of example, the masks 41 can be formed likewise to the masks 39 in such a way that a silicon nitride film and a polycrystalline silicon film are respectively stacked in succession and are thereafter subjected to anisotropic etching such as RIE.

Next, a p-type impurity is introduced into the principal surface part of the semiconductor substrate 1 in the isolation domain Iso and among the semiconductor elements of the active domain Act. The p-type impurity is introduced by ion implantation which employs, for example, B at a dose on the order of $10^{13}$ [atoms/cm$^2$] and which is carried out at an energy level of about 60–80 [keV]. The introduced p-type impurity is subjected to drive-in diffusion, thereby to form a p$^+$-type semiconductor region 6. The p$^+$-type semiconductor region 6 constructs an element isolating region.

Figure 11:
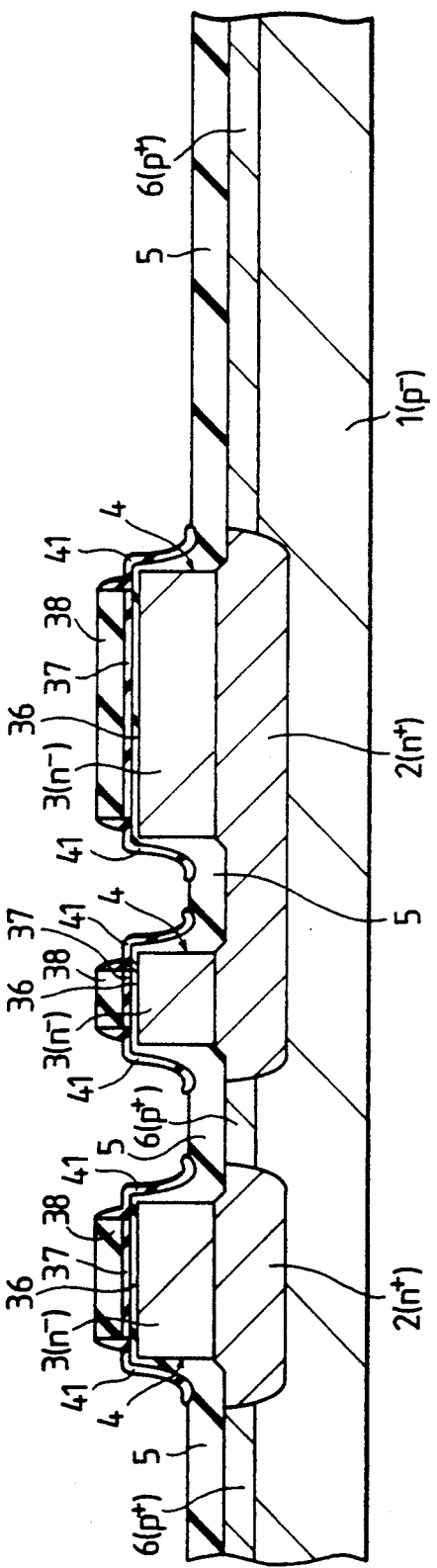

Next, as shown in FIG. 11, an element isolating insulator film 5 is formed on the front surface parts of the epitaxial layer 3 corresponding to the side walls of the salient island regions 4 and on the other front surface parts of the epitaxial layer 3 (or the semiconductor substrate 1). The element isolating insulator film 5 can be formed in such a way that the front surface of the epitaxial layer 3 (or the semiconductor substrate 1) is subjected to the thermal oxidation treatment by the use of the masks 41. The element isolating insulator film 5 is consequently constructed of a silicon oxide film, and it is formed at a thickness of about 3000–5000 [Å] which is comparatively small as an element isolating insulator film, lest crystal defects should appear at the corner parts of the salient island regions 4. After the element isolating insulator film 5 has been formed, the masks 41 are selectively removed.

Figure 12:
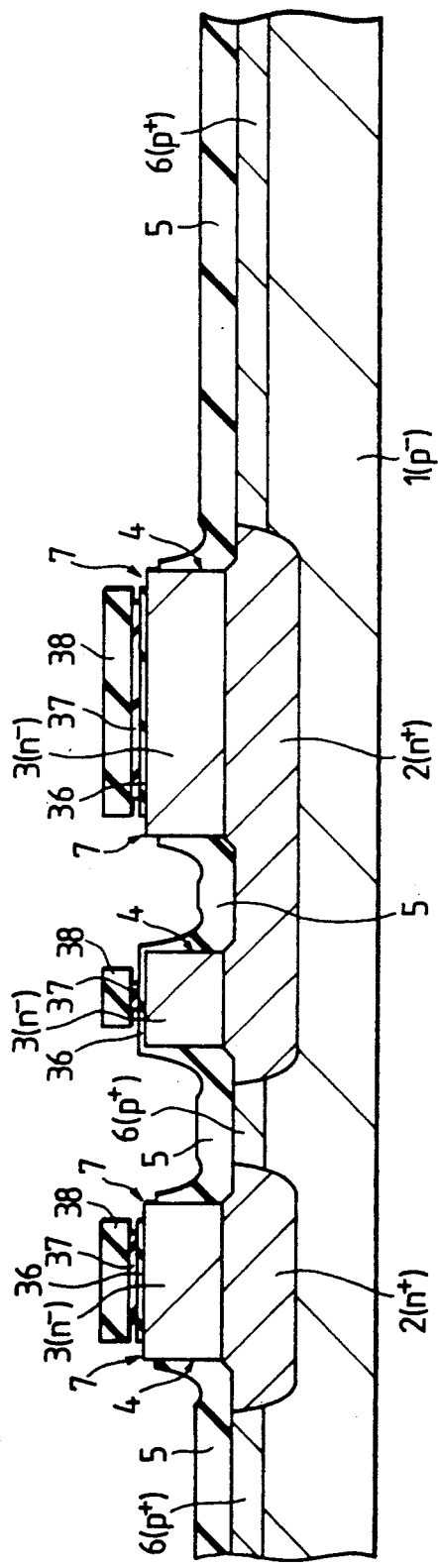

Subsequently, as shown in FIG. 12, in each area for forming the base region of a bipolar transistor Tr, the mask 36 or element isolating insulator film 5 on the corner part, namely, shoulder part of the side wall of the salient island region 4 is removed so as to form a contact hole 7. The contact hole 7 serves to connect the base region (9) and base lead-out electrode (8A) of the bipolar transistor Tr.

Subsequently, a first layer for forming electrodes is deposited on the whole area of the substrate including the element isolating insulator film 5 and the mask 38. By way of example, the electrode forming layer is constructed of a polycrystalline silicon film deposited by CVD and is formed at a thickness of about 6000–8000 [Å]. Parts of the electrode forming layer come into touch with the parts of the front surface of the epitaxial layer 3 corresponding to the shoulder parts of the salient island regions 4 through the contact holes 7.

Subsequently, a thin silicon oxide film is formed on the front surface of the electrode forming layer, whereupon a p-type impurity is introduced into the electrode forming layer through the silicon oxide film. This silicon oxide film is provided in order to prevent heavy metal contamination ascribable to the introduction of the impurity and to relieve the damages of the front surface of the electrode forming layer. The p-type impurity is introduced by ion implantation which employs B at a dose on the order of $10^{16}$ [atoms/cm$^2$] and which is carried out at an energy level of about 30–50 [keV]. This p-type impurity is introduced in order to lower the resistance of the electrode forming layer. The p-type impurity introduced into the electrode forming layer is diffused from this electrode forming layer into the principal surface parts of the epitaxial layer 3 at the parts of the contact holes 7, thereby to form the p$^+$-type semiconductor regions 9. These p$^+$-type semiconductor regions 9 are formed in self-alignment with the contact holes 7. They serve to form parts of the base regions.

Subsequently, although no illustration is made, a silicon oxide film and a photoresist film are respectively stacked on the whole area of the electrode forming layer in succession. Using anisotropic etching, the uppermost photoresist film, the silicon oxide film and the electrode forming layer are successively etched (etched back) for flattening. That is, those parts of the electrode forming layer which are deposited on the convex parts of the salient island regions 4 are removed except the part of the electrode forming layer buried in the concave part among the salient island regions 4, whereby the front surface of the semiconductor substrate is flattened. Thereafter, the uppermost mask 38 on the salient island regions 4 is removed by isotropic etching.

Next, as shown in FIG. 13, the part of the electrode forming layer in the active domain Act and the part thereof in the isolation domain Iso are subjected to predetermined patterning operations, thereby to form the base lead-out electrodes 8A in the active domain Act and dummy saliences 8B in the isolation domain Iso, respectively. The base lead-out electrodes 8A and the dummy saliences 8B are respectively formed by the identical steps of manufacture. The electrode forming layer is patterned by, for example, anisotropic etching.

Next, as shown in FIG. 14, in each area for forming the high resistance R$_H$ of a memory cell, a p$^-$-type semiconductor region 10 is formed in the principal surface part of the epitaxial layer 3 of the salient island region 4. By way of example, the p$^-$-type semiconductor region 10 can be formed in such a way that B at a dose on the order of $10^{13}$ [atoms/cm$^2$] is introduced by ion implantation at an energy level of about 30–50 [keV]. The high resistance R$_H$ is finished up by forming the p$^-$-type semiconductor region 10. Incidentally, the high resistance R$_H$ may well be formed before the step of patterning the electrode forming layer, namely, before the step of forming the base lead-out electrodes 8A.

Figure 15:
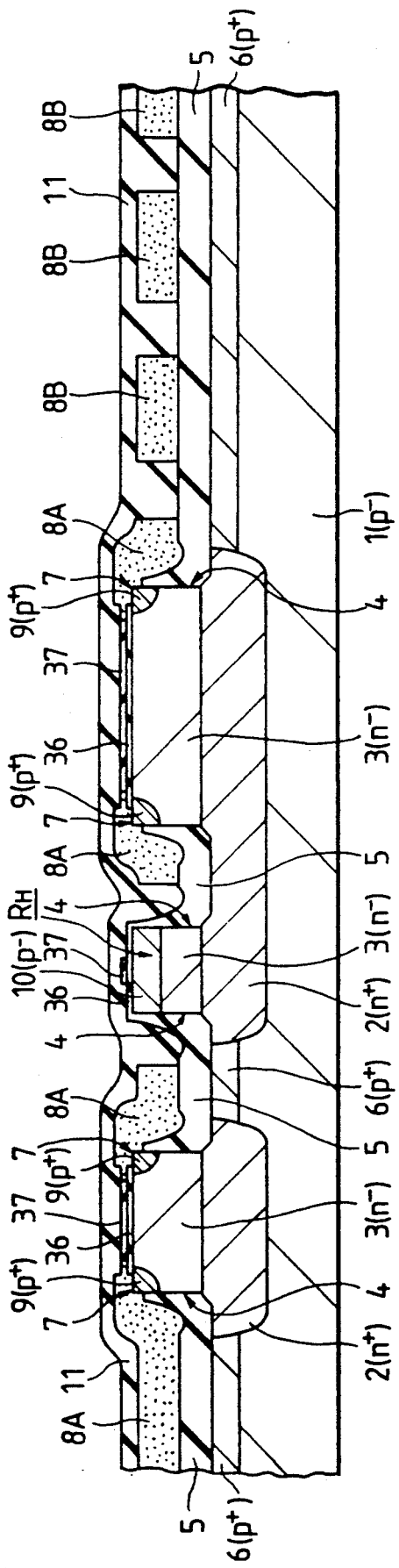

Next, as shown in FIG. 15, an inter-layer insulator film 11 is formed on the whole area of the substrate including the base lead-out electrodes 8A and the dummy saliences 8B. In order to enhance the flatness of the substrate surface, the inter-layer insulator film 11 is constructed of, for example, a composite film which is configured of a silicon oxide film deposited by CVD and a silicon oxide film applied thereon by SOG (Spin-On-Glass coating). By way of example, the inter-layer insulator film 11 has the lower silicon oxide film formed at a thickness of about 7000–8000 [Å] and has the upper silicon oxide film formed at a thickness of about 1000–1500 [Å]. The flatness of the front surface of the inter-layer insulator film 11 may well be further enhanced in such a way that, after being applied by the SOG, the upper silicon oxide film is subjected to a densifying treatment and is subjected to anisotropic etching over the whole area thereof.

At the next step, a mask 42 is formed on the whole area of the inter-layer insulator film 11. The mask 42 is used as a mask for etching the inter-layer insulator film 11 and a mask for enduring thermal oxidation. This mask 42 is constructed of, for example, a composite film which is configured of a silicon oxide film deposited by CVD and a silicon nitride film deposited thereon by CVD.

At the next step, the mask 42 is selectively removed in areas for forming the base regions and emitter regions of the bipolar transistors Tr and for forming each Schottky barrier diode SBD. Using the remaining part of the mask 42, the inter-layer insulator film 11 is removed to provide openings 12. The openings 12 are formed in the active domain Act so that the front surfaces of the parts of the base lead-out electrodes 8A on their sides connected with the base regions may be exposed.

Figure 16:
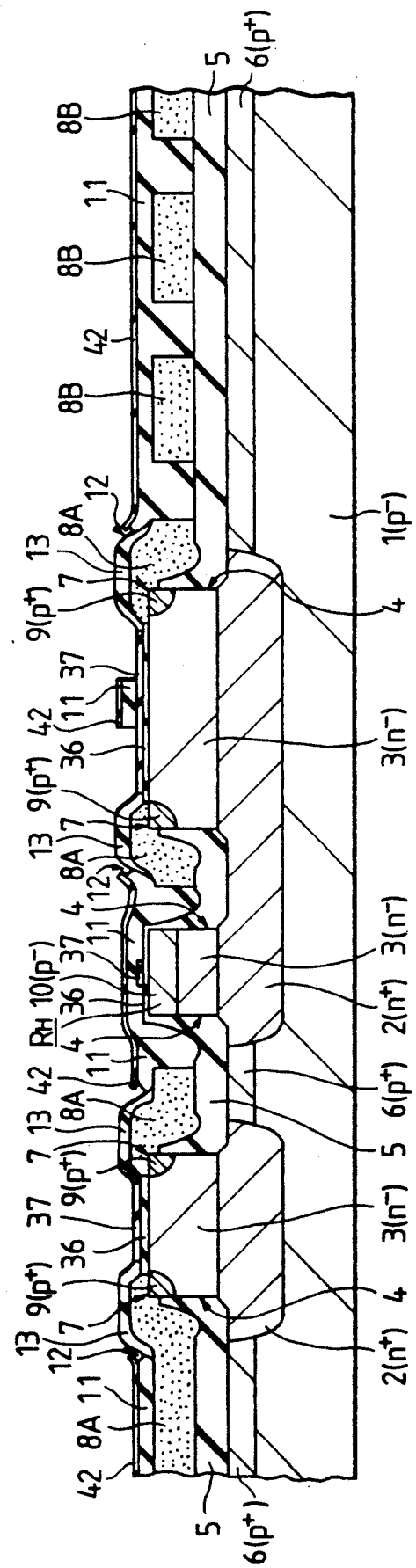

Next, as shown in FIG. 16, an inter-layer insulator film 13 is formed on the exposed partial surfaces of the base lead-out electrodes 8A by employing the mask 42 and the mask 37 on the salient island regions 4. The inter-layer insulator film 13 is constructed of a silicon oxide film which is formed by subjecting the front surfaces of the base lead-out electrodes 8A to the thermal oxidation treatment. This inter-layer insulator film 13 is formed at a thickness of, for example, about 3000-4000 [Å]. It is provided so as to electrically isolate the base lead-out electrodes 8A and emitter lead-out electrodes (19) as well as collector lead-out electrodes (19) from each other. The mask 42 is formed so that only the aforementioned parts of the base lead-out electrodes 8A may be subjected to the thermal oxidation treatment, and that the other parts of the base lead-out electrodes 8A, namely, the end parts of the base lead-out electrodes 8A in the extending directions thereof or the element isolating insulator film 5 may not undergo the thermal oxidation treatment. This is intended to prevent oxygen from being supplied into the semiconductor substrate 1 through the parts of the element isolating insulator film 5 underneath the end parts of the base lead-out electrodes 8A or the parts of the element isolating insulator film 5 near the former parts. In a case where the oxygen has been supplied into the semiconductor substrate 1, the front surface of the semiconductor substrate 1 is oxidized, and crystal defects become liable to appear within this semiconductor substrate 1.

Subsequently, the mask 42 is removed as shown in FIG. 17. Simultaneously with this step of removing the mask 42, the mask 37 on the salient island regions 4 is removed.

Subsequently, although no illustration is made, the intrinsic base region (p-type semiconductor region 45) of each forward bipolar transistor of n-p-n type Tr, which differs from the forward bipolar transistor $Tr_1$ and reverse bipolar transistor $Tr_2$ of the memory cell and which constitutes a logic portion or the peripheral circuit (such as decoder circuit) of a memory portion, is formed (refer to FIG. 3). As illustrated in FIG. 3 referred to before, the forward bipolar transistor Tr is constructed of the SICOS. As in the forward bipolar transistor $Tr_1$ or the reverse bipolar transistor $Tr_2$, the intrinsic base region of the forward bipolar transistor Tr is formed in the principal surface part of the epitaxial layer 3 of the salient island region 4. By way of example, this intrinsic base region can be formed in such a way that B at a dose on the order of $10^{13}$ [atoms/cm$^2$] is introduced by ion implantation at an energy level of about 15-30 [keV].

Subsequently, in each area for forming the reverse bipolar transistor $Tr_2$, a p-type semiconductor region 14 and an n-type semiconductor region 15 are respectively and successively formed in the principal surface part of the epitaxial layer 3 of the salient island region 4 as illustrated in FIG. 18. The p-type semiconductor region 14 is used as the base region of the reverse bipolar transistor $Tr_2$ and as the potential barrier region thereof to minority carriers which are created in the semiconductor substrate 1 by alpha particles. This p type semiconductor region 14 can be formed in such a way that B at a dose on the order of $10^{13}$ [atoms/cm$^2$] is introduced by ion implantation at an energy level of about 140-160 [keV]. The n-type semiconductor region 15 is used as a part of the collector region. This n-type semiconductor region 15 can be formed in such a way that P at a dose on the order of $10^{13}$ [atoms/cm$^2$] is introduced by ion implantation at an energy level of about 140-160 [keV]. Each of the p-type impurity for forming the p-type semiconductor region 14 and the n-type impurity for forming the n-type semiconductor region 15 is introduced within an extent which is defined by the inter-layer insulator film 13 formed on the front surface of the base lead-out electrode 8A.

Subsequently, in each area for forming the forward bipolar transistor $Tr_1$, low resistance $R_L$ and Schottky barrier diode SBD of the memory cell, a p-type semiconductor region 16 and an n-type semiconductor region 17 are respectively and successively formed in the principal surface part of the epitaxial layer 3 of the salient island region 4 as illustrated in FIG. 19. The p-type semiconductor region 16 is used as the base region of the forward bipolar transistor $Tr_1$ and as the potential barrier region thereof to minority carriers which are created in the semiconductor substrate 1 by alpha particles. This p-type semiconductor region 16 can be formed in such a way that $B^{++}$ at a dose on the order of $10^{13}$ atoms/cm$^2$] is introduced by ion implantation at an energy level of about 80-100 [keV]. The n-type semiconductor region 17 is used as a part of the emitter region of the transistor $Tr_1$ and as a part of the low resistance $R_L$. This n-type semiconductor region 17 can be formed in such a way that P at a dose on the order of $10^{13}$ [atoms/cm$^2$] is introduced by ion implantation at an energy level of about 170-190 [keV].

The p-type semiconductor region 14 which constitutes the base region of the reverse bipolar transistor $Tr_2$, and the p-type semiconductor region 16 which constitutes the base region of the forward bipolar transistor $Tr_1$, namely, the shielding region of the Schottky barrier diode SBD are constructed at the same or nearly equal impurity concentrations. Therefore, both these regions 14 and 16 can be formed by the identical step of manufacture without resorting to the separate steps as stated before. Likewise, the n-type semiconductor region 15 which constitutes the collector region of the reverse bipolar transistor $Tr_2$, and the n-type semiconductor region 17 which constitutes the emitter region of the forward bipolar transistor $Tr_1$, that is, which constructs the cathode region of the Schottky barrier diode SBD (or the low resistance $R_L$) are constructed at the same or nearly equal impurity concentrations. Therefore, both these regions 15 and 17 can be formed by the identical step of manufacture without resorting to the separate steps as stated before.

In this manner, in the semiconductor integrated circuit device having the reverse bipolar transistor $Tr_2$ of the SICOS and the shielded type Schottky barrier diode SBD, the shielding region (p-type semiconductor region 16) of the shielded type Schottky barrier diode SBD is formed, and simultaneously, the base region (p-type semiconductor region 14) of the reverse bipolar transistor $Tr_2$ is formed, whereby the base region of the reverse bipolar transistor $Tr_2$ can be formed by the step of forming the shielding region, so that the number of manufacturing steps of the semiconductor integrated circuit device can be decreased.

Besides, in the semiconductor integrated circuit device having the reverse bipolar transistor $Tr_2$ of the SICOS and the Schottky barrier diode SBD, the cathode region (n-type semiconductor region 17) of the Schottky barrier diode SBD is formed, and simultaneously, the collector region (n-type semiconductor region 15) of the reverse bipolar transistor $Tr_2$ is formed, whereby the collector region of the reverse bipolar transistor $Tr_2$ can be formed by the step of forming the cathode region, so that the number of manufacturing steps of the semiconductor integrated circuit device can be decreased.

After the p-type semiconductor region 16 and the n-type semiconductor region 17 have been formed, an n-type impurity is introduced into the principal surface part of the n-type semiconductor region 17 in the area for forming the Schottky barrier diode SBD, thereby to form an n-type semiconductor region 46 as shown in FIG. 20. The n-type semiconductor region 46 is used as the virtual cathode region of the Schottky barrier diode SBD. This n-type semiconductor region 46 can be formed in such a way that P (or As) at a dose on the order of, for example, $10^{12}$ [atoms/cm$^2$] is introduced by ion implantation at an energy level of about 20–30 [keV].

Subsequently, in the respective areas for forming the forward bipolar transistor $Tr_1$ and the reverse bipolar transistor $Tr_2$, the mask 36 on the salient island regions 4 is removed so as to form contact holes (an emitter opening and a collector opening) 18. The mask 36 is removed within extents which are defined by the inter-layer insulator film 13 formed on the front surfaces of the base lead-out electrodes 8A.

At the next step, a second layer for forming electrodes is deposited on the whole area of the substrate. By way of example, the electrode forming layer is constructed of a polycrystalline silicon film deposited by CVD and is formed at a thickness of about 2000–3000 [Å]. Parts of the electrode forming layer come into touch with the respective n-type semiconductor regions 15 and 17 of the salient island regions 4 through the contact holes 18.

At the next step, a thin silicon oxide film is formed on the front surface of the electrode forming layer, whereupon an n-type impurity is introduced into the electrode forming layer through the silicon oxide film. The n-type impurity is introduced by ion implantation which employs As at a dose on the order of, for example, $10^{16}$ [atoms/cm$^2$] and which is carried out at an energy level of about 70–90 [keV].

Next, the n-type impurity introduced into the electrode forming layer is subjected to an activating treatment (annealing). Owing to the activating treatment, the n-type impurity introduced into the parts of the electrode forming layer corresponding to the contact holes 18 is diffused into the principal surface parts of the respective n-type semiconductor regions 15 and 17. The n-type impurity diffused into the principal surface part of the n-type semiconductor region 15 forms an n$^+$-type semiconductor region 20 which serves as a part of the collector region of the reverse bipolar transistor $Tr_2$. On the other hand, the n-type impurity diffused into the principal surface part of the n-type semiconductor region 17 forms an n$^+$-type semiconductor region 20 which serves as a part of the emitter region of the forward bipolar transistor $Tr_1$. Both the forward bipolar transistor $Tr_1$ and the reverse bipolar transistor $Tr_2$ are finished up by the step of forming the n$^+$-type semiconductor regions 20. The element As as the n-type impurity exhibits a diffusion rate lower than that of another n-type impurity such as P, and can form a shallower emitter junction.

Next, as shown in FIG. 21, the second layer for forming electrodes is subjected to predetermined patterning, thereby to form the emitter lead-out electrode 19 and the collector lead-out electrode 19, respectively. The emitter lead-out electrode 19 is connected to the emitter region (n$^+$-type semiconductor region 20) of the forward bipolar transistor $Tr_1$. The collector lead-out electrode 19 is connected to the collector region (n$^+$-type semiconductor region 20) of the reverse bipolar transistor $Tr_2$.

Subsequently, an inter-layer insulator film 21 is formed on the whole area of the substrate including the emitter lead-out electrode 19 and the collector lead-out electrode 19. By way of example, the inter-layer insulator film 21 is constructed of a composite film which is configured of a PSG film deposited by CVD, and a silicon oxide film applied thereon by SOG (Spin-On-Glass). The inter-layer insulator film 21 is formed at a thickness of, for example, about 3000–5000 [Å].

Subsequently, in each area for forming a capacitor Ca, the inter-layer insulator film 21 is selectively removed to form an opening 22 through which the front surface of the lower electrode 19 of the capacitor Ca is exposed.

Subsequently, a dielectric film 23 and an upper electrode 23 are respectively and successively formed on the lower electrode 19 so as to come into touch with the front surface of this lower electrode 19 through the opening 22. The capacitor Ca is finished up as shown in FIG. 22 by the step of forming the dielectric film 23' and the upper electrode 23. By way of example, the dielectric film 23' is made of $Ta_2O_5$ deposited by sputtering and is formed at a thickness of about 70–100 [Å]. By way of example, the upper electrode 23 is made of $MoSi_2$ deposited by sputtering and is formed at a thickness of about 1500–2500 [Å]. The dielectric film 23' and the upper electrode 23 are respectively formed in the same pattern.

Subsequently, an inter-layer insulator film 24 is formed on the whole area of the substrate including the capacitor Ca. By way of example, the inter-layer insulator film 24 is constructed of a PSG film deposited by CVD and is formed at a thickness of about 2500–3500 [Å].

Next, those parts of the inter-layer insulator film 24 which overlie the emitter lead-out electrode 19, collector lead-out electrode 19, base lead-out electrodes 8A, n-type semiconductor region 17, etc. are removed to form contact holes 25.

Next, a platinum film is deposited on the whole area of the substrate so as to touch, at least, the front surface of the n-type semiconductor region 46 through the contact hole 25. Thereafter, annealing is performed for causing the n-type semiconductor region 46 and the platinum film to react, whereby a platinum silicide film (not shown) is formed on the principal surface of the n-type semiconductor region 46. The platinum silicide film is formed at a thickness on the order of several hundred [Å]. The unreacted part of the platinum film except the platinum silicide film is selectively removed. The platinum silicide film is used as the anode region of the Schottky barrier diode SBD. The shielded type Schottky barrier diode SBD is finished up by forming the platinum silicide film.

Figure 23:
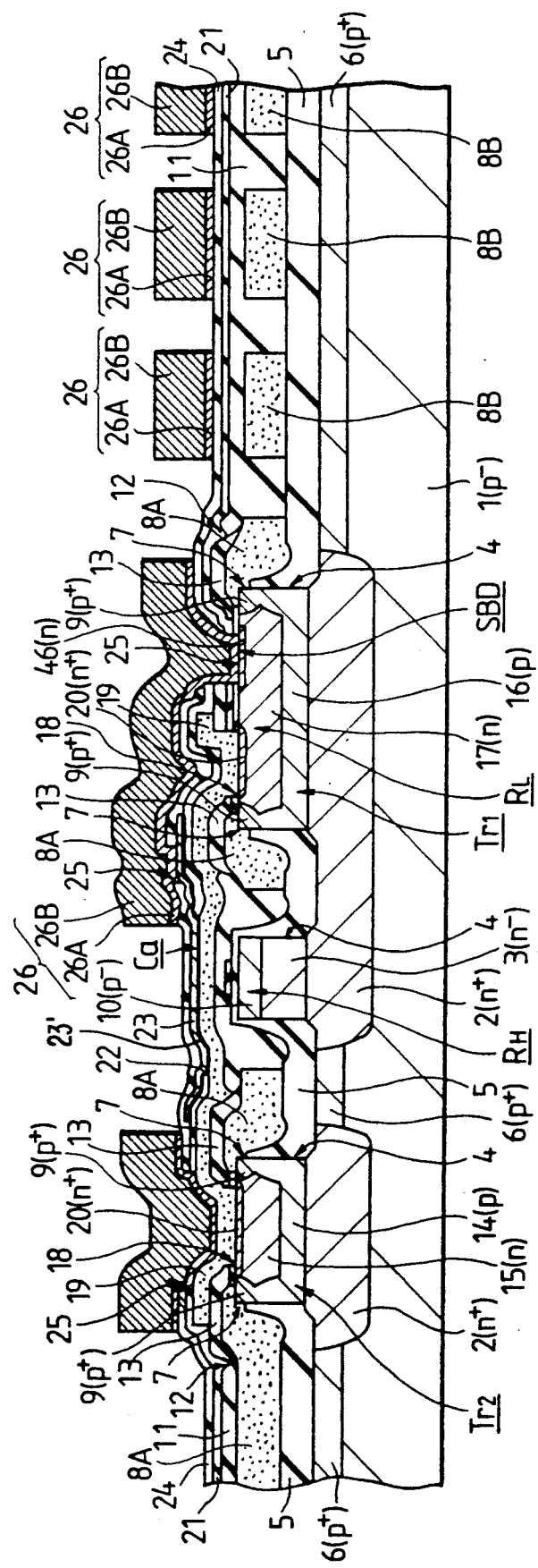

Next, as shown in FIG. 23, a first layer of wiring 26 is formed so as to touch the emitter lead-out electrode 19, etc. through the contact holes 25. By way of example, the wiring 26 is constructed of a composite film which is configured of a barrier metal film 26A deposited by sputtering and an aluminum film 26B deposited thereon by sputtering.

Subsequently, an inter-layer insulator film 27, a second layer of wiring 28, an inter-layer insulator film 29, a third layer of wiring 30, an inter-layer insulator film 31, a fourth layer of wiring 32 and a passivation film 33 are respectively and successively formed, whereby the semiconductor integrated circuit device is finished up as shown in FIG. 1.

Although, in the above, the invention made by the inventors has been concretely described in conjunction with the embodiments, it is a matter of course that the present invention is not restricted to the foregoing embodiments, but that it can be variously altered within a scope not departing from the purport thereof.

By way of example, in the resistance switching type memory cell with SBDs, the present invention may well construct a reverse bipolar transistor in such a way that an n-type impurity (As, P or Sb) is introduced at a high concentration into a region which corresponds to the epitaxial layer 3 of a forward bipolar transistor Tr (refer to FIG. 3) outside the memory cell, and that an emitter region of the high impurity concentration formed by the above introduction is held in touch with the bottom of a base region (in this case, a p-type semiconductor region 45). The n-type impurity to be introduced into the region corresponding to the epitaxial layer 3 is introduced by ion implantation. The ion implantation is superior to diffusion in the controllability of an impurity concentration distribution.

In addition, the present invention is especially effective when applied to a semiconductor integrated circuit device having SICOS-bipolar transistors forming salient island regions 4, but it is applicable to a semiconductor integrated circuit device having bipolar transistors of any other structure. By way of example, the present invention is applicable to a semiconductor integrated circuit device having bipolar transistors of SST (Super Self-aligned Technology) structure.

Besides, the present invention is applicable to a semiconductor integrated circuit device of the mixed type in which bipolar transistors and complementary MISFETs coexist.

Effects which are attained by typical aspects of performance of the present invention will be briefly explained below:

In a semiconductor integrated circuit device having forward and reverse bipolar transistors of SICOS, a raised operating speed can be achieved.

Moreover, in a semiconductor integrated circuit device having a reverse bipolar transistor of SICOS and an SBD element, the number of manufacturing steps for attaining the aforementioned effect can be decreased.

Moreover, in a semiconductor integrated circuit device having an SBD element and a resistance element connected in series therewith, the SBD element can have the dispersion of its forward voltage relieved and can have its refractoriness enhanced, and the resistance element can have its resistance set to be optimal.

What is claimed is:

1. A semiconductor memory device, comprising:
    a semiconductor body having a main surface; and
    at least one memory cell formed at said main surface, said memory cell including a first bipolar transistor and a second bipolar transistor, a collector of said first bipolar transistor being coupled to a base of said second bipolar transistor, a collector of said second bipolar transistor being coupled to a base of said first bipolar transistors, and each of emitters of said first and second bipolar transistors being coupled to a complementary data line pair of said memory device.
    wherein each of said first and second bipolar transistors forms a cross-coupled switching transistor in said memory cell and is formed to operate in an inverse mode such that each of said first and second bipolar transistors includes:
    a buried layer formed within said semiconductor body to serve as an emitter region;
    a first semiconductor region formed to directly contact an upper surface of said buried layer to serve as a base region; and
    a second semiconductor region formed to have an upper surface at said main surface of said semiconductor body and a lower surface in contact with an upper surface of said first semiconductor region, wherein said second semiconductor region serves as a collector region,
    wherein said semiconductor body is comprised of a semiconductor substrate of a first conductivity type and an epitaxial layer of a second conductivity type, wherein said buried layer is formed between said epitaxial layer and said semiconductor substrate, and wherein said first and second semiconductor regions are formed within said epitaxial layer,
    wherein said buried layer has said second conductivity type, said first semiconductor region has said first conductivity type and said second semiconductor region has said second conductivity type, and
    wherein said buried layer has a higher impurity concentration than said first semiconductor region.

2. A semiconductor memory device according to claim 1, wherein each of said first and second bipolar transistors further includes a third semiconductor region formed at said main surface of said semiconductor body in said second semiconductor region to serve as part of the collector region, and wherein said third semiconductor region has a higher impurity concentration than said second semiconductor region, and wherein said third semiconductor region has said second conductivity type.

3. A semiconductor memory device according to claim 2, wherein said buried layer has a higher impurity concentration than the impurity concentrations of said first and second semiconductor regions ut lower than an impurity concentration of said third semiconductor region.

4. A semiconductor memory device according to claim 3 wherein each of said first and second bipolar transistors further comprises a fourth semiconductor region formed between said first semiconductor region and the main surface of said semiconductor body, wherein said fourth semiconductor region has a higher impurity concentration than said first semiconductor region, and wherein said fourth semiconductor region serves as part of said base region.

5. A semiconductor memory device according to claim 1, wherein said memory device further comprises a third transistor formed in a peripheral circuit portion of said semiconductor body, wherein said third transistor is formed to operate in a forward mode such that a collector of said third transistor includes said buried layer and an additional collector layer formed in contact with an upper surface of said buried layer, and wherein said third transistor further comprises:

a base semiconductor region formed to contact an upper surface of said additional collector layer; and an emitter semiconductor region formed to have an upper surface at said main surface of said semiconductor body and a lower surface in contact with an upper surface of said base semiconductor region, wherein said additional collector layer, said base semiconductor region and said emitter semiconductor region are all formed in said epitaxial layer, and wherein said first semiconductor regions of said first and second transistors extend deeper into said epitaxial layer than said base semiconductor region of said third transistor.

6. A semiconductor memory device according to claim 1, wherein said semiconductor body includes a plurality of grooves which are formed at said main surface of said semiconductor body so that each of said first and second transistors s formed in a protruding portion formed by said epitaxial layer to protrude above said buried layer, and wherein said first and second semiconductor regions of said first and second transistors are formed in said protruding portion.

7. A semiconductor memory device according to claim 5, wherein said semiconductor body includes a plurality of grooves which are formed at said main surface of said semiconductor body so that each of said first and second transistors is formed in a protruding portion formed by said epitaxial layer to protrude above said buried layer, and wherein said first and second semiconductor regions of said first and second transistors are formed in said protruding portion and so that said third transistor is formed in another protruding portion formed by said epitaxial layer to protrude above said buried layer, wherein said emitter semiconductor region, said base semiconductor region and said additional collector layer are all formed in said another protruding portion.

* * * * *